(12) United States Patent
Lee et al.

(10) Patent No.: US 12,160,991 B2
(45) Date of Patent: Dec. 3, 2024

(54) SEMICONDUCTOR DEVICE AND DATA STORAGE SYSTEM INCLUDING THE SAME

(71) Applicant: Samsung Electronics Co., Ltd., Suwon-si (KR)

(72) Inventors: Haemin Lee, Seoul (KR); Jongsoo Kim, Seoul (KR); Hyeonjoo Song, Suwon-si (KR); Juyeon Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 424 days.

(21) Appl. No.: 17/528,233

(22) Filed: Nov. 17, 2021

(65) Prior Publication Data
US 2022/0208789 A1 Jun. 30, 2022

(30) Foreign Application Priority Data
Dec. 24, 2020 (KR) .......................... 10-2020-0183044

(51) Int. Cl.
| | |
|---|---|
| H10B 43/27 | (2023.01) |
| H01L 23/528 | (2006.01) |
| H10B 41/10 | (2023.01) |
| H10B 41/27 | (2023.01) |
| H10B 41/35 | (2023.01) |
| H10B 41/40 | (2023.01) |
| H10B 43/10 | (2023.01) |

(Continued)

(52) U.S. Cl.
CPC ......... *H10B 43/27* (2023.02); *H01L 23/5283* (2013.01); *H10B 41/10* (2023.02); *H10B 41/27* (2023.02); *H10B 41/35* (2023.02); *H10B 41/40* (2023.02); *H10B 43/10* (2023.02); *H10B 43/35* (2023.02); *H10B 43/40* (2023.02)

(58) Field of Classification Search
CPC ......... H10B 43/27; H10B 41/10; H10B 41/27
See application file for complete search history.

(56) References Cited

U.S. PATENT DOCUMENTS

| | | |
|---|---|---|
| 9,406,692 B2 | 8/2016 | Lee |
| 10,600,800 B2 | 3/2020 | Nishikawa et al. |
| 10,692,883 B2 | 6/2020 | Uchiyama |

(Continued)

FOREIGN PATENT DOCUMENTS

CN 111602244 A 8/2020

*Primary Examiner* — Brian Turner
(74) *Attorney, Agent, or Firm* — Muir Patent Law, PLLC

(57) ABSTRACT

A semiconductor device comprises a stack structure including interlayer insulating layers and gate layers alternately stacked on a lower structure; and a memory vertical structure, separation structures, and support vertical structures penetrating the stack structure, wherein the gate layers include a lower gate layer, an upper gate layer, and intermediate gate layers, wherein the separation structures include a first separation structure, wherein the support vertical structures include a first inner support vertical structure penetrating the lower gate layer, the intermediate gate layers, and the upper gate layer, and adjacent to the first separation structure, wherein a portion of the first inner support vertical structure is directly connected to the first separation structure on the same level as the upper gate layer, and wherein a portion of the first inner support vertical structure is spaced apart from the first separation structure on the same level as the lower gate layer.

20 Claims, 25 Drawing Sheets

(51) Int. Cl.
  *H10B 43/35* (2023.01)
  *H10B 43/40* (2023.01)

(56) References Cited

U.S. PATENT DOCUMENTS

| | | |
|---|---|---|
| 10,777,577 B2 | 9/2020 | Cheon et al. |
| 2015/0236038 A1 | 8/2015 | Pachamuthu et al. |
| 2020/0075625 A1 | 3/2020 | Kobayashi et al. |
| 2020/0212059 A1 | 7/2020 | Nishikawa |
| 2021/0035965 A1* | 2/2021 | Mizutani ................ H01L 25/18 |

* cited by examiner

SEMICONDUCTOR DEVICE AND DATA STORAGE SYSTEM INCLUDING THE SAME

CROSS TO REFERENCE TO RELATED APPLICATION(S)

This application claims benefit of priority under 35 U.S.C. § 119 to Korean Patent Application No. 10-2020-0183044, filed on Dec. 24, 2020, in the Korean Intellectual Property Office, the disclosure of which is incorporated herein by reference in its entirety.

BACKGROUND

Example embodiments of the present disclosure relate to a semiconductor device and a data storage system including the same.

A semiconductor device for storing high-capacity data in an electronic system requiring data storage has been necessary. Accordingly, a method of increasing data storage capacity of a semiconductor device has been studied. For example, as one of methods for increasing data storage capacity of a semiconductor device, a semiconductor device including memory cells arranged three-dimensionally, instead of memory cells arranged two-dimensionally, has been suggested.

SUMMARY

An example embodiment of the present disclosure is to provide a semiconductor device which may improve integration density and reliability.

An example embodiment of the present disclosure is to provide a data storage system including a semiconductor device.

According to an example embodiment of the present disclosure, a semiconductor device includes a stack structure including interlayer insulating layers and gate layers alternately stacked on a lower structure in a vertical direction; a memory vertical structure penetrating the stack structure; a plurality of separation structures penetrating the stack structure; and a plurality of support vertical structures penetrating the stack structure, wherein the gate layers include a lower gate layer, an upper gate layer on the lower gate layer, and a plurality of intermediate gate layers spaced apart from each other in the vertical direction between the lower gate layer and the upper gate layer, wherein the plurality of separation structures include a first separation structure, wherein the plurality of support vertical structures include a first inner support vertical structure penetrating the lower gate layer, the plurality of intermediate gate layers, and the upper gate layer, the first inner support vertical structure being adjacent to the first separation structure, wherein a first portion of the first inner support vertical structure is directly connected to the first separation structure on the same level as the upper gate layer, and wherein a second portion of the first inner support vertical structure is spaced apart from the first separation structure on the same level as the lower gate layer.

According to an example embodiment of the present disclosure, a semiconductor device includes a stack structure including interlayer insulating layers and gate layers alternately stacked in a vertical direction on a lower structure; a plurality of separation structures penetrating the stack structure; a plurality of support vertical structures penetrating the stack structure in a staircase area on the lower structure; and a memory vertical structure penetrating the stack structure in a memory cell array area on the lower structure, wherein the gate layers include a lower gate layer, an upper gate layer on the lower gate layer, and a plurality of intermediate gate layers spaced apart from each other in the vertical direction between the lower gate layer and the upper gate layer, wherein the gate layers include gate pads arranged in a staircase shape within the staircase area, wherein the plurality of separation structures includes a first separation structure, wherein the plurality of support vertical structures include inner support vertical structures and outer support vertical structures, disposed in the staircase area, wherein the inner support vertical structures penetrate the lower gate layer, the plurality of intermediate gate layers, and the upper gate layer, wherein a side surface of at least one of the inner support vertical structures includes an upper portion in contact with the first separation structure on the same levels as the gate layers, wherein the outer support vertical structures penetrate the lower gate layer and the plurality of intermediate gate layers in a position spaced apart from the upper gate layer, and wherein an entire side surface of one of the outer support vertical structures is spaced apart from the first separation structure.

According to an example embodiment of the present disclosure, a data storage system includes a main substrate; a semiconductor device on the main substrate; and a controller electrically connected to the semiconductor device on the main substrate, wherein the semiconductor device includes a stack structure including interlayer insulating layers and gate layers alternately stacked on a lower structure in a vertical direction; a memory vertical structure penetrating the stack structure; a plurality of separation structures penetrating the stack structure; and a plurality of support vertical structures penetrating the stack structure, wherein the gate layers include a lower gate layer, an upper gate layer on the lower gate layer, and a plurality of intermediate gate layers spaced apart from each other in the vertical direction between the lower gate layer and the upper gate layer, wherein the plurality of separation structures includes a first separation structure, wherein the plurality of support vertical structures includes a first inner support vertical structure penetrating the lower gate layer, the plurality of intermediate gate layers, and the upper gate layer, the first inner support vertical structure being adjacent to the first separation structure, wherein a first portion of the first inner support vertical structure is directly connected to the first separation structure on the same level as the upper gate layer, and wherein a second portion of the first inner support vertical structure is spaced apart from the first separation structure on the same level as the lower gate layer.

BRIEF DESCRIPTION OF DRAWINGS

The above and other aspects, features, and advantages of the present disclosure will be more clearly understood from the following detailed description, taken in conjunction with the accompanying drawings, in which like numerals refer to like elements throughout. In the drawings.

DETAILED DESCRIPTION

Figure 1A:
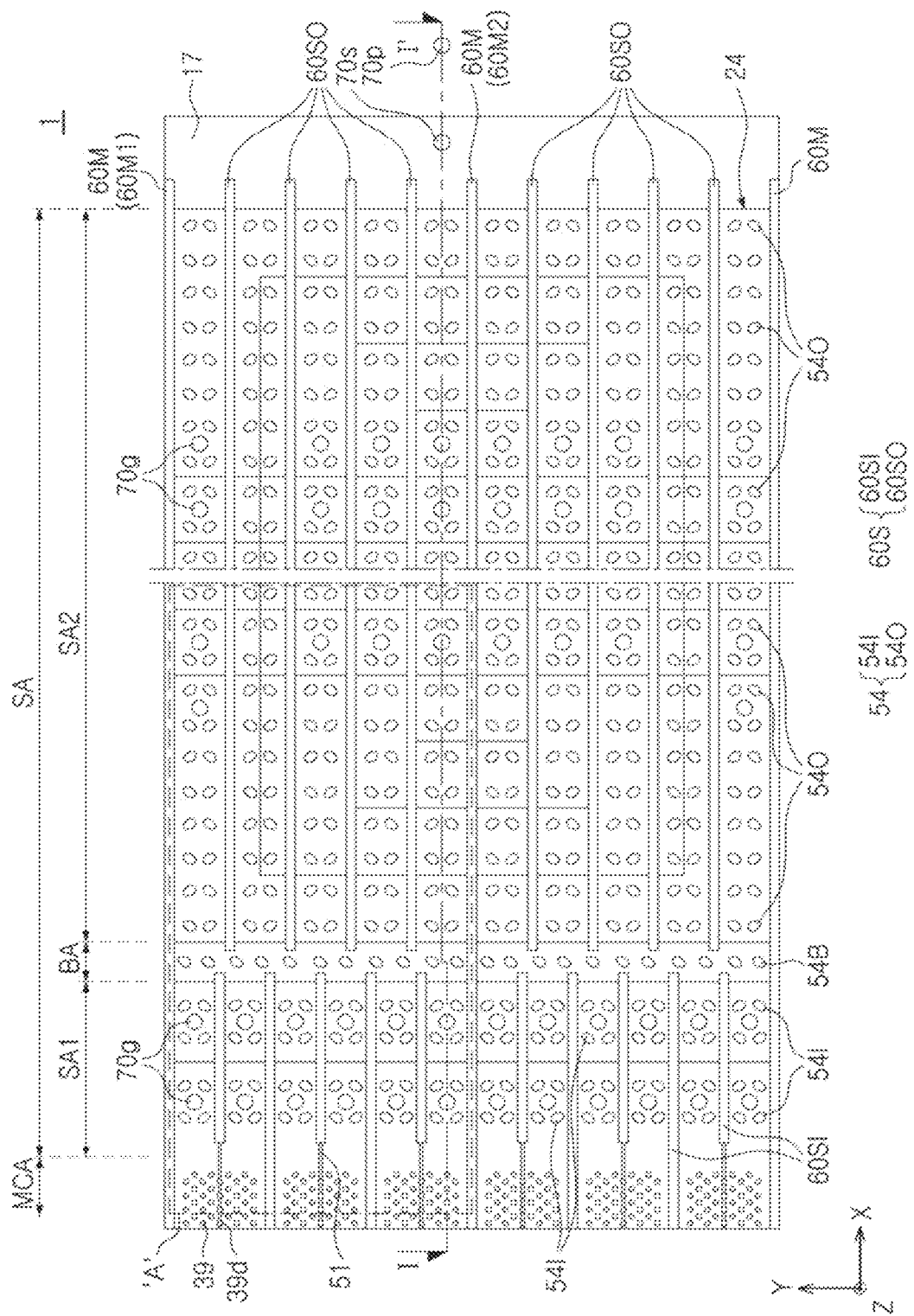
FIG. 1A is a plan diagram illustrating a semiconductor device, according to an example embodiment of the present disclosure.

Hereinafter, embodiments of the present disclosure will be described as follows with reference to the accompanying drawings.

Hereinafter, the terms such as "upper," "upper portion," "upper surface," "lower," "lower portion," and "lower surface" may be indicated by reference numerals based on the drawings unless otherwise indicated. The terms such as "upper portion," "intermediate portion," and "lower portion" may be replaced with other terms such as "first," "second," and "third," for example, and may be used to describe elements of example embodiments. The terms such as "first," "second," and "third" may be used to describe elements, but the elements are not limited by the terms, and may also be referred to as "first element," "second element," and "third element." Unless the context indicates otherwise, these terms are only used to distinguish one element, component, region, layer, or section from another element, component, region, layer, or section, for example as a naming convention. In addition, in certain cases, even if a term is not described using "first," "second," "third," etc., in the specification, it may still be referred to as "first," "second," or "third" in claims in order to distinguish different claimed elements from each other.

Figure 1B:
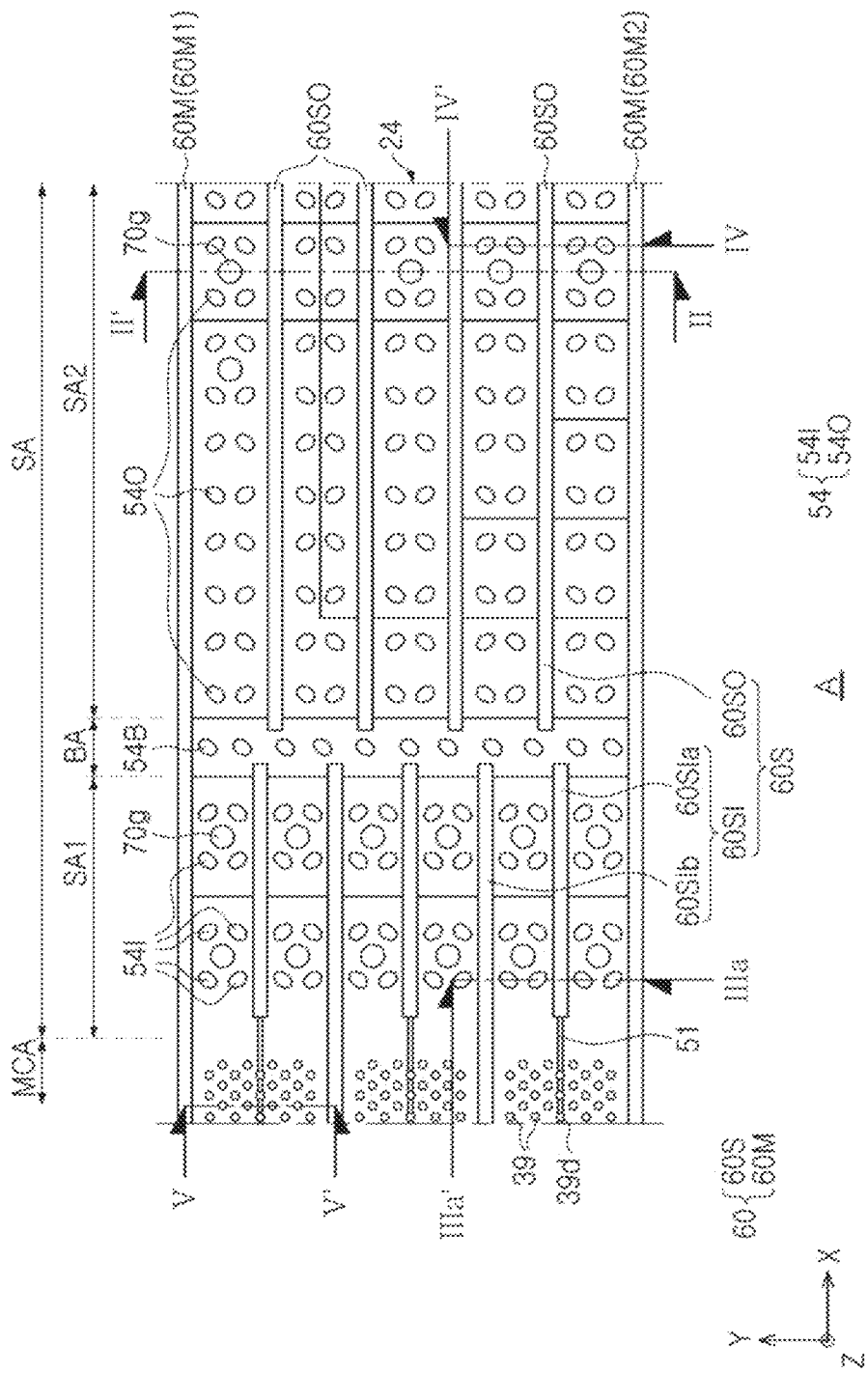
FIG. 1B is an enlarged plan diagram illustrating a portion of the semiconductor device illustrated in FIG. 1A.
Figure 2A:
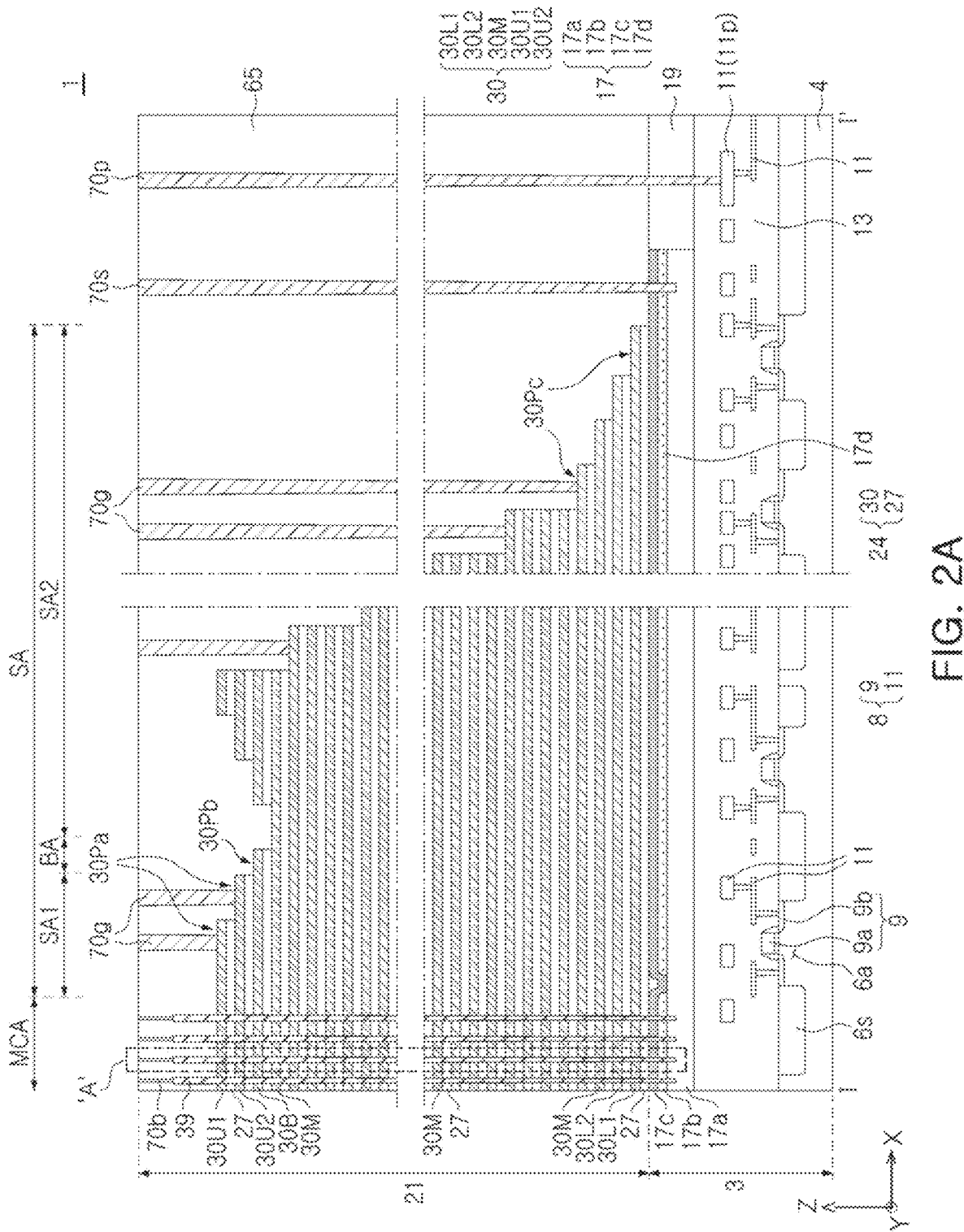
FIGS. 2A to 2E are cross-sectional diagrams illustrating a semiconductor device, according to an example embodiment of the present disclosure.
Figure 2B:
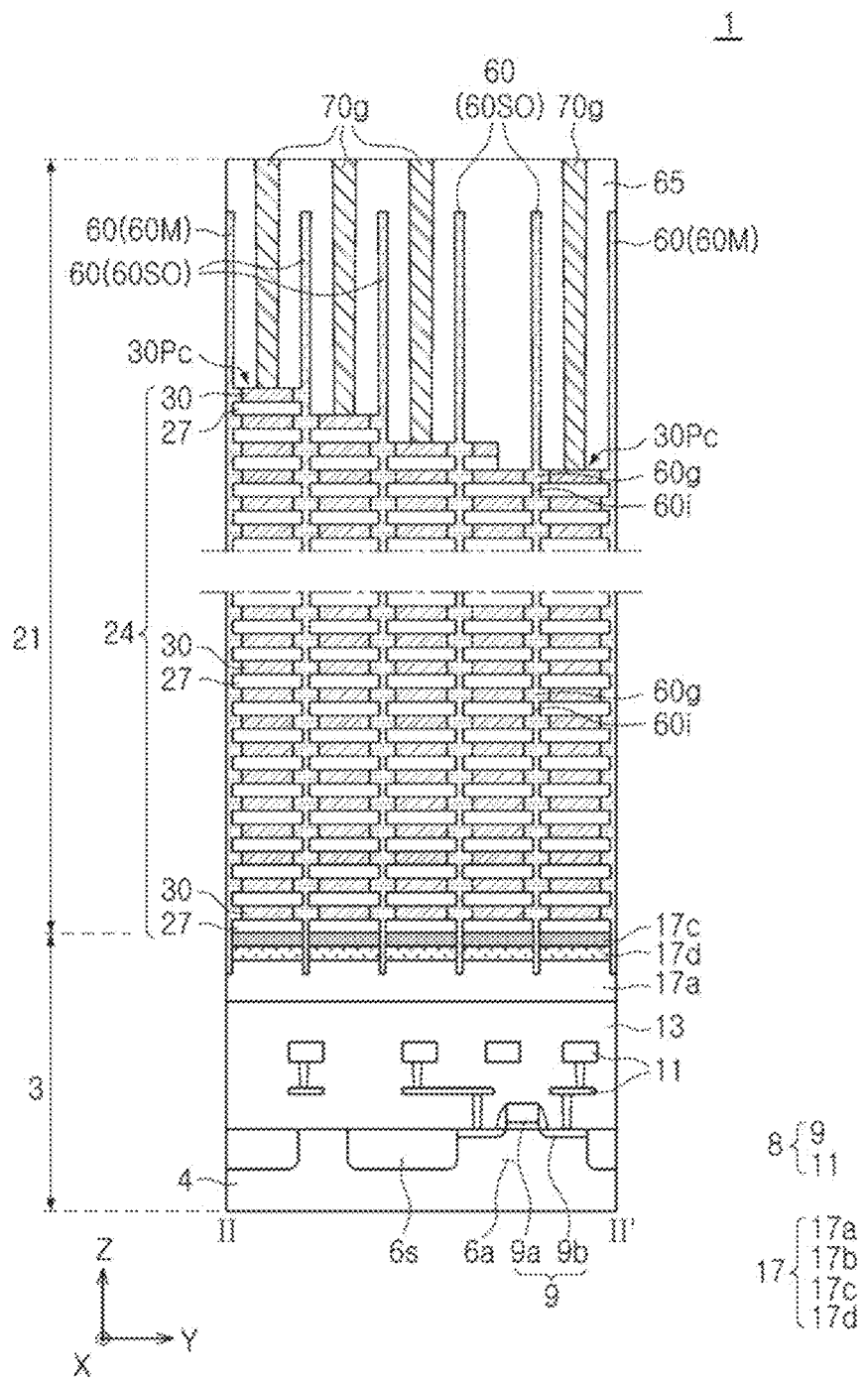
Figure 2C:
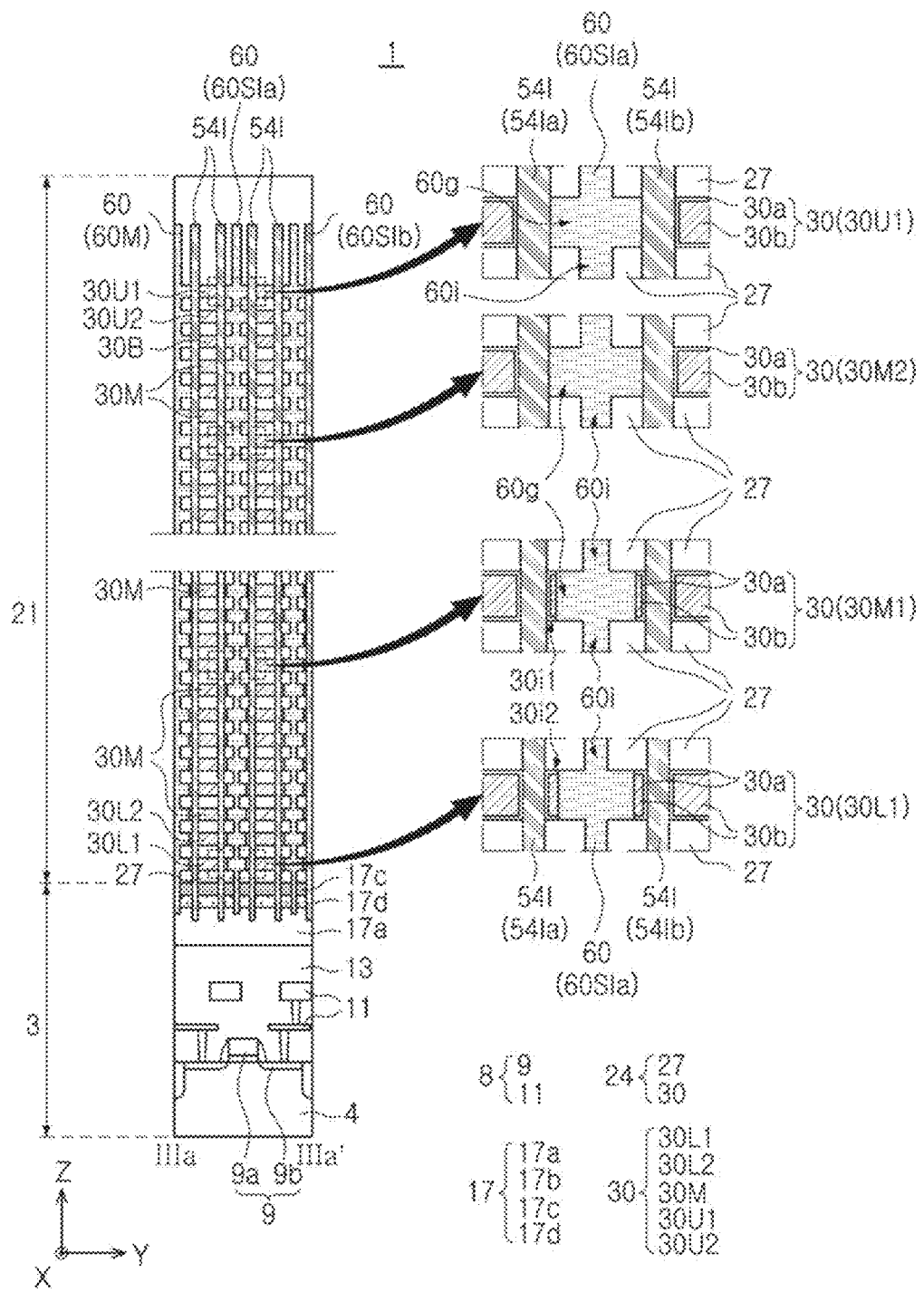
Figure 2D:
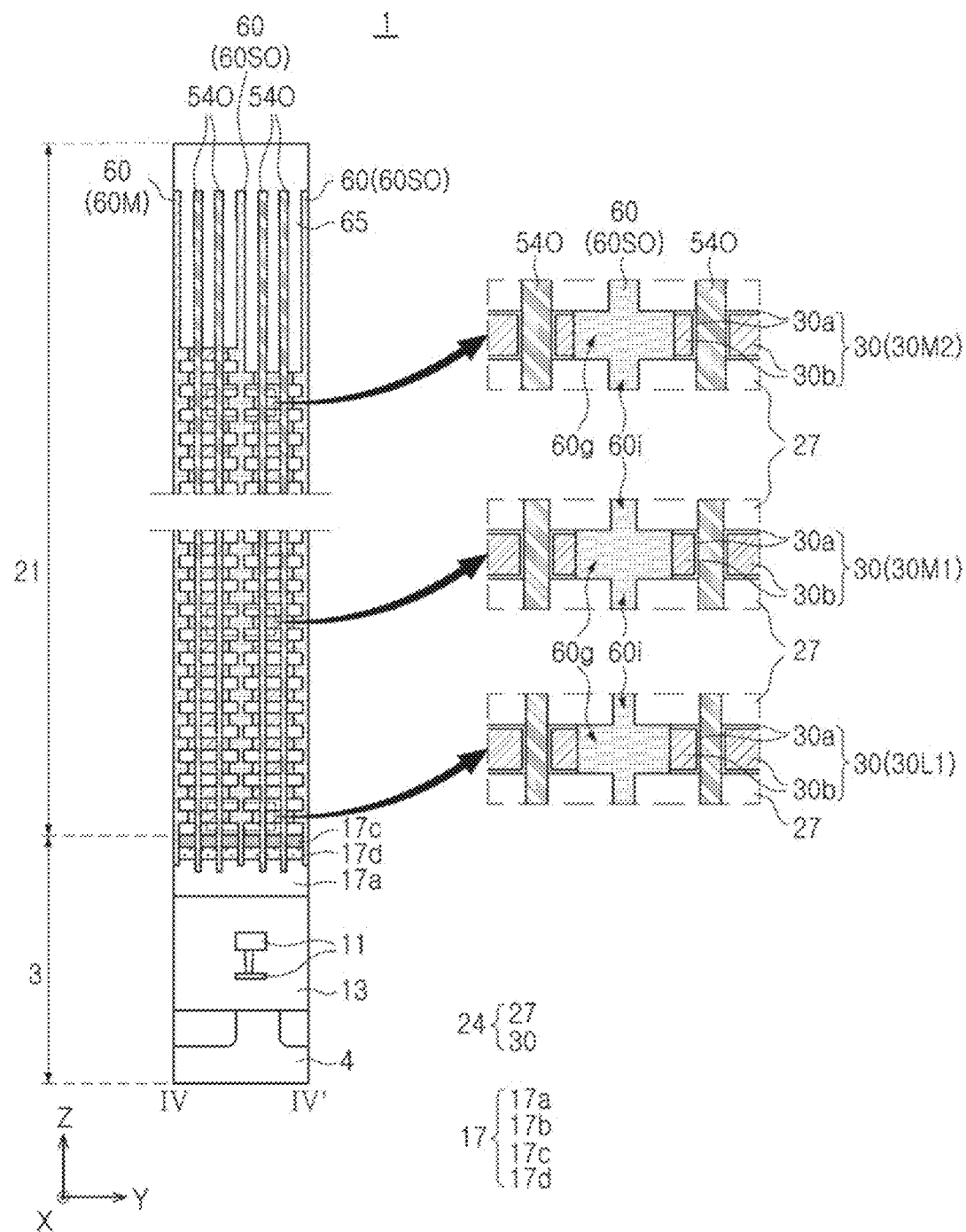
Figure 2E:
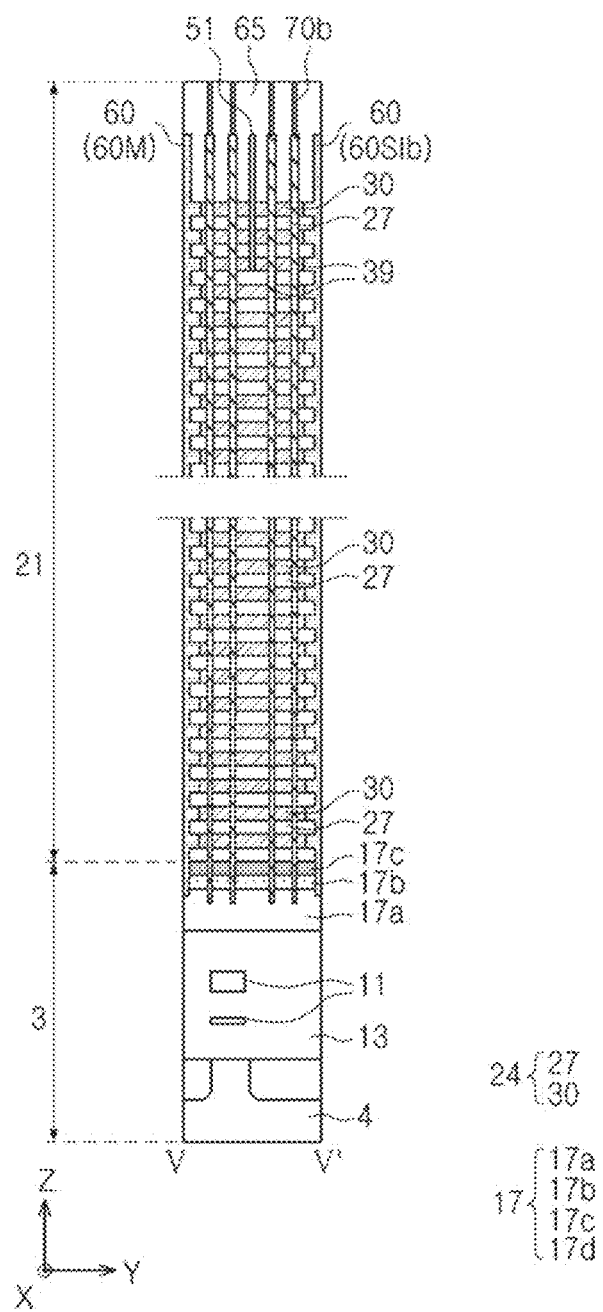

An example embodiment of a semiconductor device will be described with reference to FIGS. 1A to 2E. In FIGS. 1A to 2E, FIG. 1A is a plan diagram illustrating a semiconductor device according to an example embodiment, and FIG. 1B is an enlarged plan diagram illustrating portion "A" in FIG. 1A. FIG. 2A is a cross-sectional diagram taken along line I-I' in FIG. 1A. FIG. 2B is a cross-sectional diagram taken along line II-II' in FIG. 1A. FIG. 2C is a cross-sectional diagram taken along line IIIa-IIIa' in FIG. 1B. FIG. 2D is a cross-sectional diagram taken along line IV-IV' in FIG. 1B. FIG. 2E is a cross-sectional diagram taken along line V-V' in FIG. 1B.

Referring to FIGS. 1A to 2E, a semiconductor device 1 according to an example embodiment may include a first structure 3 and a second structure 21 overlapping the first structure 3 in a vertical direction Z.

In an example, the first structure 3 may include a pattern structure 17. The pattern structure 17 may include at least one silicon layer.

In an example, the pattern structure 17 may include a first pattern layer 17a, a second pattern layer 17b, a third pattern layer 17c, and a fourth pattern layer 17d. The second pattern layer 17b and the fourth pattern layer 17d may be spaced apart from each other on the first pattern layer 17a. For example, the second pattern layer 17b and the fourth pattern layer 17d may overlap one another in the first horizontal direction X and/or the second horizontal direction Y. The third pattern layer 17c may cover the second pattern layer 17b and the fourth pattern layer 17d on the first pattern layer 17a. The first pattern layer 17a may have a thickness greater than a thickness of each of the second pattern layer 17b, the third pattern layer 17c, and the fourth pattern layer 17d. At least one of the first pattern layer 17a, the second pattern layer 17b, the third pattern layer 17c, and the fourth pattern layer 17d may include a silicon layer. For example, the first pattern layer 17a, the second pattern layer 17b, and the third pattern layer 17c may include a silicon layer, a silicon layer having N-type conductivity, for example. The fourth pattern layer 17d may include a material different from that of the silicon layer. For example, the fourth pattern layer 17d may include a plurality of layers stacked in order, e.g., a silicon oxide layer, a silicon nitride layer, and a silicon oxide layer stacked in order.

In an example, the first structure 3 may further include a semiconductor substrate 4, a device isolation layer 6s defining a peripheral active area 6a on the semiconductor substrate 4, a peripheral circuit 8 formed on the semiconductor substrate 4, and a lower insulating layer 13 covering the peripheral circuit 8 on the semiconductor substrate 4. The peripheral circuit 8 may include a circuit device 9 such as a transistor, including a peripheral gate 9a and a peripheral source/drain 9b, and a circuit interconnection 11 electrically connected to the circuit device 9. A portion of the circuit interconnection 11 may be a peripheral pad 11p. The pattern structure 17 may be disposed on the lower insulating layer 13.

In an example, the first structure 3 may further include an intermediate insulating layer 19 on a side surface of the pattern structure 17.

The second structure 21 may include a stack structure 24 including interlayer insulating layers 27 and gate layers 30 alternately stacked in the vertical direction Z, a plurality of memory vertical structures 39 penetrating through the stack structure 24, a plurality of separation structures 60 penetrating through the stack structure 24, and a plurality of support vertical structures 54 penetrating through the stack structure 24. The second structure 21 may further include an upper insulating layer 65 covering the stack structure 24. The memory vertical structure 39, the plurality of separation structures 60, and the plurality of support vertical structures 54 may extend upwardly from a portion penetrating through the stack structure 24.

In an example, the second structure 21 may include a first area MCA and a second area SA. The first area MCA may be a memory cell array area. The second area SA may be a staircase area. The second area SA may be referred to as an extended area or a gate contact area.

Hereinafter, the first area MCA will be referred to as a memory cell array area, and the second area SA will be referred to as a staircase area.

In an example embodiment, the second pattern layer 17b may be disposed below the memory cell array area MCA, and the fourth pattern layer 17d may be disposed below the staircase area SA.

The gate layers 30 may be stacked and spaced apart from each other in the vertical direction Z in the memory cell array area MCA, and may extend from the memory cell array area MCA into the staircase area SA to have a staircase shape. Accordingly, the gate layers 30 may include gate pads 30Pa, 30Pb, and 30Pc arranged in a staircase shape in the staircase area SA. Each of the gate pads 30Pa, 30Pb, and 30Pc of the gate layers 30 may refer to an area exposed without being covered by another gate layer so as to form a staircase shape.

The staircase area SA may include a first staircase area SA1, a buffer area BA, and a second staircase area SA2 disposed in order in the first horizontal direction X to be spaced apart from the memory cell array area MCA.

The gate layers 30 may include one or a plurality of lower gate layers 30L1 and 30L2, one or a plurality of upper gate layers 30U1 and 30U2, a plurality of intermediate gate layers 30M disposed between the one or the plurality of lower gate layers 30L1 and 30L2 and the one or the plurality of upper gate layers 30U1 and 30U2, and a buffer gate layer 30B disposed between the plurality of intermediate gate layers 30M and the one or the plurality of upper gate layers 30U1 and 30U2.

In an example embodiment, the one or the plurality of upper gate layers 30U1 and 30U2 may be provided as a plurality of upper gate layers 30U1 and 30U2 spaced apart from each other in the vertical direction Z. For example, the plurality of upper gate layers 30U1 and 30U2 may include a first upper gate layer 30U1 and a second upper gate layer 30U2 disposed below the first upper gate layer 30U1.

In an example embodiment, the one or the plurality of lower gate layers 30L1 and 30L2 may be a plurality of lower gate layers 30L1 and 30L2 spaced apart from each other in the vertical direction Z. For example, the plurality of lower gate layers 30L1 and 30L2 may include a first lower gate layer 30L1 and a second lower gate layer 30L2 disposed on the first lower gate layer 30L1.

In an example embodiment, a portion of the plurality of intermediate gate layers 30M may be word lines.

In an example embodiment, the first lower gate layer 30L1 may be a ground select gate line of a ground select transistor, and the second lower gate layer 30L2 may be a dummy gate line. In another example, the first lower gate layer 30L1 may be an erase control gate line of an erase control transistor used in an erase operation for erasing data stored in memory cells using a gate induced drain leakage (GIDL) phenomenon.

In an example embodiment, the plurality of upper gate layers 30U1 and 30U2 may be string select gate lines of string select transistors. In another example, among the plurality of upper gate layers 30U1 and 30U2, the first upper gate layer 30U1 may be an erase control gate line of an erase control transistor, and the second upper gate layer 30U2 may be a string select gate line of a string select transistor.

The gate pads 30Pa of the plurality of upper gate layers 30U1 and 30U2 may be disposed in the first staircase area SA1, the gate pad 30Pb of the buffer gate layer 30B may be disposed in the buffer staircase area BA, and the gate pads 30Pc of the plurality of intermediate gate layers 30M and the plurality of lower gate layers 30L1 and 30L2 may be disposed in the second staircase area SA2.

In an example, each of the gate layers 30 may include a first layer 30a (in FIGS. 2C and 2D) and a second layer 30b (in FIGS. 2C and 2D). The first layer 30a may cover an upper surface and a lower surface of the second layer 30b and may cover a portion of side surfaces of the second layer 30b. For example, the first layer 30a may include a portion interposed between the second layer 30b and the memory vertical structure 39 and a portion interposed between the second layer 30b and the plurality of support vertical structures 54. In example embodiments, the portion of the first layer 30a interposed between the second layer 30b and the memory vertical structure 39 may contact the memory vertical structure 39, and the portion of the first layer 30a interposed between the second layer 30b and the plurality of support vertical structures 54 may contact the plurality of support vertical structures 54. The first layer 30a and the second layer 30b may be in contact with the separation structures 60. As used herein, the term "contact" refers to a direct connection (i.e., touching) unless the context indicates otherwise.

In an example, the first layer 30a may include a dielectric material, and the second layer 30b may include a conductive material. For example, the first layer 30a may include a high-k dielectric such as AlO, and the second layer 30b may include a conductive material such as TiN, WN, Ti, or W.

In another example, the first layer 30a may include a first conductive material (e.g., TiN, WN, or the like), and the second layer 30b may include a second conductive material (e.g., Ti, W, or the like) different from the first conductive material.

In another example, each of the gate layers 30 may be formed of one or two or more of doped polysilicon, a metal-semiconductor compound (e.g., TiSi, TaSi, CoSi, NiSi or WSi), a metal nitride (e.g., TiN, TaN or WN), or a metal (e.g., Ti or W).

The plurality of memory vertical structures 39 may penetrate through the stack structure 24 in the memory cell array area MCA. The plurality of memory vertical structures 39 may be in contact with the pattern structure 17.

The second structure 21 may further include string separation patterns 51 extending lengthwise in the first horizontal direction X and penetrating through the plurality of upper gate layers 30U1 and 30U2. The string separation pattern 51 may penetrate the buffer gate layer 30B. The string separation patterns 51 may include an insulating material such as silicon oxide. The string separation patterns 51 may be disposed on a level higher than the plurality of intermediate gate layers 30M. For example, lower surfaces of the string separation patterns 51 may be at a higher vertical level than upper surfaces of the plurality of intermediate gate layers 30M.

The second structure 21 may further include dummy vertical structures 39*d* having the same material and the same cross-sectional structure as those of the plurality of memory vertical structures 39, penetrating the string separation pattern 51 and extending downwardly, and penetrating the plurality of intermediate gate layers 30M and the plurality of lower gate layers 30L1 and 30L2.

The plurality of separation structures 60 may include a plurality of main separation structures 60M parallel to each other. The plurality of main separation structures 60M may include a first separation structure 60M1 and a second separation structure 60M2 adjacent to each other.

The plurality of main separation structures 60M may penetrate the stack structure 24, and the stack structure 24 may be separated by the plurality of main separation structures 60M in the second horizontal direction Y. The second horizontal direction Y may be perpendicular to the first horizontal direction X.

The plurality of separation structures 60 may further include a plurality of secondary separation structures 60SI and 60SO. For example, between the first separation structure 60M1 and the second separation structure 60M2 adjacent to each other, the plurality of secondary separation structures 60SI and 60SO may include inner separation structures 60SI and outer separation structures 60SO.

The inner separation structures 60SI may include first inner separation structures 60SIa and second inner separation structures 60SIb. The first inner separation structures 60SIa may be in contact with the string separation patterns 51 and may be disposed in the first staircase area SA1. The second inner separation structures 60SIb may be disposed in the memory cell array area MCA and the first staircase area SA1.

The outer separation structures 60SO may be disposed in the second staircase area SA2. The outer separation structures 60SO may have end portions extending into the buffer area BA, and the inner separation structures 60SI may have end portions extending into the buffer area BA.

The inner separation structures 60SI may be spaced apart from the outer separation structures 60SO.

The inner separation structures 60SI may penetrate and may be in contact with the plurality of lower gate layers 30L1 and 30L2, the plurality of intermediate gate layers 30M, the buffer gate layer 30B, and the plurality of upper gate layers 30U1 and 30U2. The inner separation structures 60SI may be in contact with the pattern structure 17.

The outer separation structures 60SO may penetrate and may be in contact with the plurality of lower gate layers 30L1 and 30L2 and the plurality of intermediate gate layers 30M, may be in contact with the buffer gate layer 30B, and may be spaced apart from the plurality of upper gate layers 30U1 and 30U2. The outer separation structures 60SO may be in contact with the pattern structure 17.

Each of the plurality of secondary separation structures 60S may have a bar shape or a linear shape extending in the first horizontal direction X.

In an example, between the first separation structure 60M1 and the second separation structure 60M2 adjacent to each other, an n number of the inner separation structures 60SI may be disposed in parallel in the second horizontal direction Y, and m number of the outer separation structures 60SO may be disposed in parallel in the second horizontal direction Y, where n and m may be natural numbers.

In an example, n may be greater than m.

In an example, n may be an odd number and m may be an even number.

In an example, when n is 5, m may be 4, when n is 7, m may be 6, and when n is 9, m may be 8.

In an example, each of the plurality of separation structures 60 may include portions in contact with the gate layers 30 and the interlayer insulating layers 27. For example, each of the plurality of separation structures 60 may include first separation portions 60*g* in contact with the gate layers 30 and the interlayer insulating layers 27 and second separation portions 60*i* in contact with the first separation portions 60*g* and the interlayer insulating layers 27. The second separation portions 60*i* may be above the first separation portions 60*g* and below the first separation portions 60*g*. Widths of the first separation portions 60*g* may be larger than widths of the second separation portions 60*i* adjacent to the first separation portions 60*g*. For example, a width of one of the first separation portions 60*g* may be greater than a width of the second separation portion 60*i* adjacent to an upper portion and a lower portion of the first separation portion 60*g*.

In an example, the plurality of support vertical structures 54 may include inner support vertical structures 54I penetrating the stack structure 24 in the first staircase area SA1, buffer support vertical structures 54B penetrating the stack structure 24 in the buffer area BA, and outer support vertical structures 54O penetrating the stack structure 24 in the second staircase area SA2.

The plurality of support vertical structures 54 may prevent deformation of the stack structure 24 in the staircase area SA. Accordingly, the plurality of support vertical structures 54 may improve reliability of the semiconductor device 1.

In an example, between the first separation structure 60M1 and the second separation structure 60M2 adjacent to each other, the inner support vertical structures 54I may be disposed to surround a center of each of the gate pads 30Pa of the upper gate layers 30U1 and 30U2.

In an example, between the first separation structure 60M1 and the second separation structure 60M2 adjacent to each other, the number of the inner support vertical structures 54I arranged in order in the horizontal direction Y may be greater than the number of the outer support vertical structure 54O arranged in order in the second horizontal direction Y.

In an example, between the first separation structure 60M1 and the second separation structure 60M2 adjacent to each other, the number of the buffer support vertical structures 54B arranged in order in the second horizontal direction Y may be less than the number of the inner support vertical structures 54I, and may be greater than the number of the outer support vertical structures 54O arranged in order in the second horizontal direction Y.

In an example, each of the plurality of support vertical structures 54 may be formed of an insulating material, silicon oxide or silicon oxide with voids formed therein, for example. A cross-sectional structure of each of the plurality of support vertical structures 54 may be different from the cross-sectional structure of each of the memory vertical structures 39. For example, the memory vertical structures 39 may include a channel material layer, and the plurality of support vertical structures 54 may not include a channel material layer. For example, the plurality of support vertical structures 54 may not include a material of the channel material layer.

In an example, the plurality of separation structures 60 may be formed of an insulating material, silicon oxide or silicon oxide with voids formed therein, for example. In another example, each of the plurality of separation structures 60 may include a conductive pattern and an insulating spacer covering a side surface of the conductive pattern.

In an example, the lower end of each of the plurality of support vertical structures 54 may be disposed on a level different from the lower end of the plurality of separation structures 60 adjacent to the plurality of support vertical structures 54. For example, among the plurality of support vertical structures 54, the lower end of one of the first inner support vertical structures 54I may be disposed on a level different from the lower end of one of the separation structures 60 adjacent to the first inner support vertical structures 54I among the plurality of separation structures 60, the lower end of the main separation structure 60M, for example. The lower end of the first inner support vertical structure 54I may be disposed on a level higher than the lower end of the main separation structure 60M adjacent to the first inner support vertical structure 54I.

The second structure 21 may further include gate contact plugs 70g, source contact plugs 70s, and peripheral contact plugs 70p. The gate contact plugs 70g may be disposed on gate pads 30Pc of the lower gate layers 30L1 and 30L2 and the intermediate gate layers 30M and gate pads 30Pa of the upper gate layers 30U1 and 30U2. The source contact plug 70s may be in contact with the first pattern layer 17a of the pattern structure 17 and may extend upwardly. The peripheral contact plug 70p may extend downwardly from a portion penetrating the second structure 21 and may be in contact with the peripheral pad 11p of the circuit interconnection 11. The second structure 21 may further include bit line contact plugs 70b electrically connected to the memory vertical structures 39 on the memory vertical structures 39.

In an example, on the same levels as the gate layers 30, at least one of the inner support vertical structures 54I may be in contact with one of the main separation structures 60M and the inner separation structures 60SIa and 60SIb. For example, on least one of the same levels as the gate layers 30, one of the inner support vertical structures 54I may be in contact with one of an adjacent separation structures 60 among the main separation structures 60M and the inner separation structures 60SIa and 60SIb.

For example, as illustrated in FIG. 2C, the inner support vertical structures 54I may include one of the main separation structures 60M and the inner separation structures 60SIa and 60SIb, e.g., a pair of inner support vertical structures 54Ia and 54Ib may be disposed on both sides of the first inner separation structure 60SIa. On least one of the same levels as the gate layers 30, at least one of the pair of inner support vertical structures 54Ia and 54Ib may be in contact with at least a portion of side surfaces of the first inner separation structure 60SIa.

In an example, at least one of the pair of inner support vertical structures 54Ia and 54Ib may be spaced apart from a side surface of the first inner separation structure 60SIa at "gate levels" which may be from the same level as the lower gate layers 30L1 and 30L2 to a level on which a portion of the intermediate gate layers 30M are disposed, and may be in contact with a side surface of the first inner separation structure 60SIa on "gate levels" which may be from a level on which the other portion of the intermediate gate layers 30M are disposed to a level on which the upper gate layers 30U1 and 30U2 are disposed. The term "gate levels" may refer to vertical levels on which the gate layers 30 are disposed. For example, as illustrated in FIG. 2C, at least one of the pair of inner support vertical structures 54Ia and 54Ib may be spaced apart from a side surface of the first inner separation structure 60SIa on a level of the first intermediate gate layer 30M1 disposed on a first level among the intermediate gate layers 30M, and may be in contact with the side surface of the first inner separation structure 60SIa on a level of the second intermediate gate layer 30M2 disposed on a second level higher than the first level among the intermediate gate layers 30M.

Accordingly, on the same levels as the gate layers 30, the side surface of one of the inner support vertical structures 54I may be adjacent to one of the main separation structures 60M and the inner separation structures 60SIa and 60SIb, e.g., an upper portion may be in contact with the first inner separation structure 60SIa and a lower portion may not be in contact with the first inner separation structure 60SIa. The upper portion may be a portion of a side surface of the inner support vertical structure 54I on the same level as the first upper gate layer 30U1 or the same level as the second intermediate gate layer 30M2 in FIG. 2C. The lower portion may be a portion of the side surface of the inner support vertical structure 54I on the same level as the first lower gate layer 30L1 or on the same level as the first intermediate gate layer 30M1.

In an example, the outer support vertical structures 54O may be spaced apart from the separation structures 60.

In the description below, a planar shape on the level on which a portion of the gate layers 30 are disposed will be described with reference to FIGS. 3A to 3D.

Figure 3A:
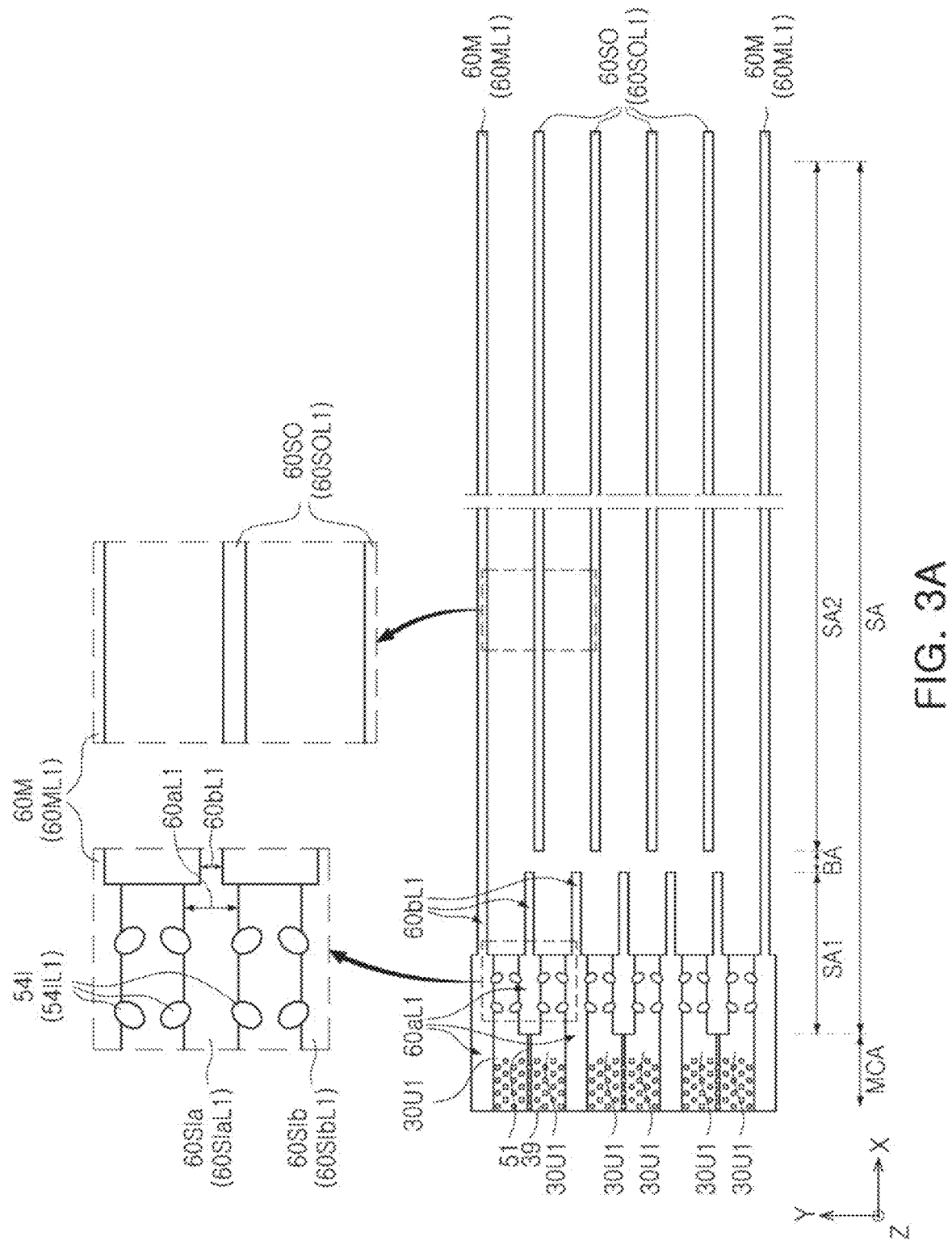
FIGS. 3A to 3D are plan diagrams illustrating a portion of elements of a semiconductor device, according to an example embodiment of the present disclosure.
Figure 3B:
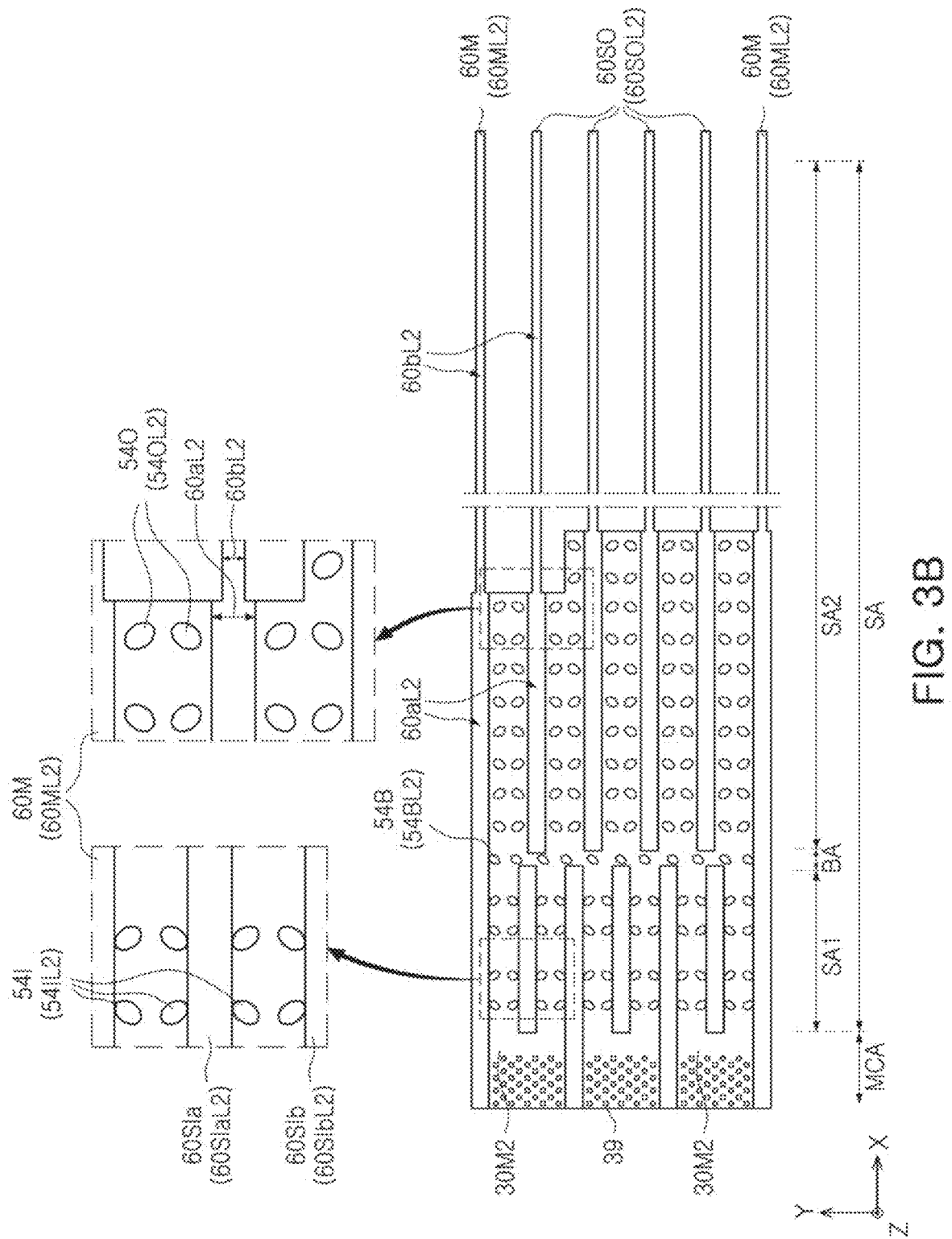
Figure 3C:
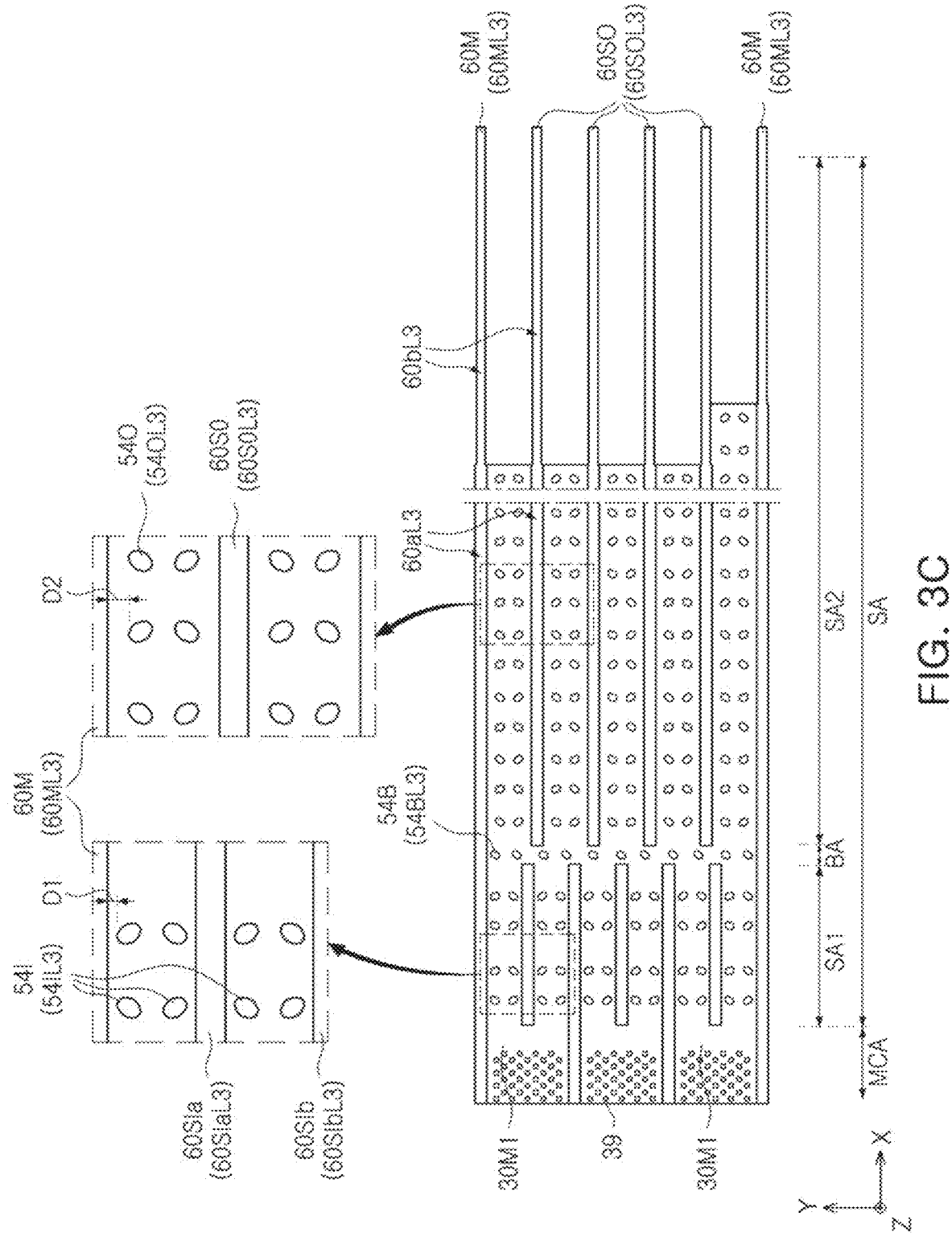
Figure 3D:
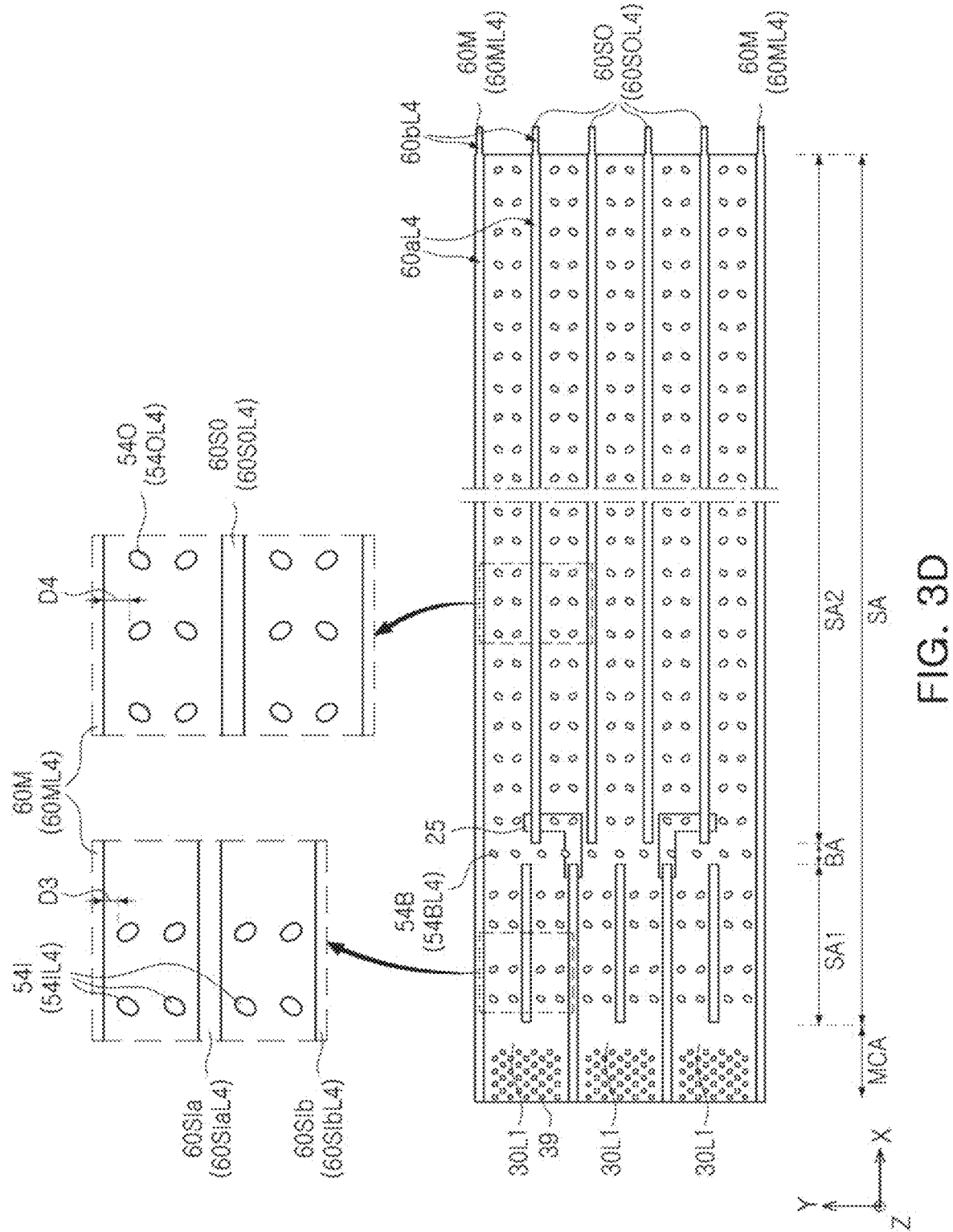

FIG. 3A is a plan diagram illustrating a planar shape on the level on which the first upper gate layer 30U1 is disposed. FIG. 3B is a plan diagram on the level on which the second intermediate gate layer 30M2 is disposed. FIG. 3C is a plan diagram illustrating a planar shape on the level on which the first intermediate gate layer 30M1 is disposed. FIG. 3D is a plan diagram illustrating a planar shape on the level on which the first lower gate layer 30L1 is disposed. FIGS. 1A and 1B may be plan diagrams illustrating each element viewed from above.

Referring to FIG. 3A, on the level on which the first upper gate layer 30U1 is disposed, each of portions 60ML1 of the main separation structures 60M and isolation portions 60SIaL1 and 60SIbL1 of the inner separation structures 60SIa and 60SIb may include a first portion 60aL1 in contact with the first upper gate layer 30U1 and a second portion 60bL1 not in contact with the first upper gate layer 30U1. A width of the first portion 60aL1 in the second direction Y may be greater than a width of the second portion 60bL1 in the second direction Y.

On the level on which the first upper gate layer 30U1 is disposed, at least one of the portions 54IL1 of the inner support vertical structures 54I may be in contact with an adjacent first portion 60aL1. At least one of the portions 54IL1 of the inner support vertical structures 54I may have a shape extending into the first portion 60aL1.

On the level on which the first upper gate layer 30U1 is disposed, each of the portions 60SOL1 of the outer separation structures 60SO may have a width in the second direction Y equal to a width in the second direction Y of the second portion 60bL1, and may have a width in the second direction Y smaller than a width in the second direction Y of the first portion 60aL1.

Referring to FIG. 3B, on the level on which the second intermediate gate layer 30M2 is disposed, each of the portions 60ML2 of the main separation structures 60M and the portions 60SOL2 of the outer separation structures 60SO may include a third portion 60aL2 in contact with the second intermediate gate layer 30M2 and a fourth portion 60bL2 not in contact with the second intermediate gate layer 30M2. A width in the second direction Y of the third portion 60aL2 may be greater than a width in the second direction Y of the fourth portion 60bL2.

On the level on which the second intermediate gate layer 30M2 is disposed, each of the portions 60SIaL2 and 60SIbL2 of the inner separation structures 60SIa and 60SIb may have a width in the second direction Y substantially equal to a width in the second direction Y of the third portion 60aL2.

In an example, on the level on which the second intermediate gate layer 30M2 is disposed, at least one of the portions 54IL2 of the inner support vertical structures 54I may be in contact with one of the portions 60SIaL2 and 60SIbL2 of the inner separation structures 60SIa and 60SIb.

In an example, on the level on which the second intermediate gate layer 30M2 is disposed, at least one of the portions 54BL2 of the buffer support vertical structures 54B may be in contact with adjacent separation structures 60M, 60SIa, 60Sib, and 60SO.

In an example, on the level on which the second intermediate gate layer 30M2 is disposed, portions 54OL2 of the outer support vertical structures 54O may be spaced apart from the main separation structures 60M and the outer separation structures 60SO.

Referring to FIG. 3C, on the level on which the first intermediate gate layer 30M1 is disposed, each of the portions 60ML3 of the main separation structures 60M and the portions 60SOL3 of the outer separation structures 60SO may include a fifth portion 60aL3 in contact with the first intermediate gate layer 30M1 and a sixth portion 60bL3 not in contact with the first intermediate gate layer 30M1. The width in the second direction Y of the fifth portion 60aL3 may be greater than the width in the second direction Y of the sixth portion 60bL3.

On the level on which the first intermediate gate layer 30M1 is disposed, each of the portions 60SIaL3 and 60SIbL3 of the inner separation structures 60SIa and 60SIb may have a width in the second direction Y substantially the same as a width in the second direction Y of the fifth portion 60aL3.

In an example, on the level on which the first intermediate gate layer 30M1 is disposed, at least one of the portions 54IL3 of the inner support vertical structures 54I may be spaced apart from the portions 60SIaL3 and 60SIbL3 of the inner separation structures 60SIa and 60SIb. For example, on the level on which the first intermediate gate layer 30M1 is disposed, portions 54IL3 of the inner support vertical structures 54I may be spaced apart from the adjacent inner separation structures 60SIa and 60SIb by a first distance D1.

In an example, on the level on which the first intermediate gate layer 30M1 is disposed, at least one of the portions 54BL3 of the buffer support vertical structures 54B may be spaced apart from adjacent separation structures 60M, 60SIa, 60SIb, and 60SO.

In an example, on the level on which the first intermediate gate layer 30M1 is disposed, portions 54OSL3 of the outer support vertical structures 54O may be spaced apart from the adjacent main separation structures 60M and the adjacent outer separation structures 60SO by a second distance D2 greater than the first distance D1.

Referring to FIG. 3D, on the level on which the first lower gate layer 30L1 is disposed, portions 60ML4 of the main separation structures 60M and portions 60SOL4 of the outer separation structures 60SO may include a seventh portion 60aL4 in contact with the first lower gate layer 30L1 and an eighth portion 60bL4 not in contact with the first lower gate layer 30L1. A width in the second direction Y of the seventh portion 60aL4 may be greater than a width in the second direction Y of the eighth portion 60bL4.

On the level on which the first lower gate layer 30L1 is disposed, each of the portions 60SIaL4 and 60SIbL4 of the inner separation structures 60SIa and 60SIb may have a width in the second direction Y substantially equal to a width in the second direction Y of the seventh portion 60aL4.

In an example, on the level on which the first lower gate layer 30L1 is disposed, at least one of the portions 54IL4 of the inner support vertical structures 54I may be spaced apart from portions 60SIaL4 and 60SIbL4 of the inner separation structures 60SIa and 60SIb. For example, on a level on which the first lower gate layer 30L1 is disposed, portions 54IL4 of the inner support vertical structures 54I may be spaced apart from the portions of the adjacent inner separation structures 60SIa and 60SIb by a third distance D3.

In an example, on the level on which the first lower gate layer 30L1 is disposed, at least one of the portions 54BL4 of the buffer support vertical structures 54B may be spaced apart from the adjacent separation structures 60M, 60SIa, 60SIb, and 60SO.

In an example, on the level on which the first lower gate layer 30L1 is disposed, portions 54OSL4 of the outer support vertical structures 54O may be spaced apart from the main separation structures 60M and the outer separation structures 60SO by a fourth distance D4 greater than the third distance D3.

In an example embodiment, the third distance D3 may be greater than the first distance D1 in FIG. 3C.

In an example embodiment, the fourth distance D4 may be greater than the second distance D2 in FIG. 3C.

By disposing the plurality of separation structures 60 and the plurality of support structures 54 as described above, a greater number of the memory vertical structures 39 may be disposed, and deformation of the stack structure 24 may be prevented, such that integration density and reliability of the semiconductor device 1 may improve.

Figure 4:
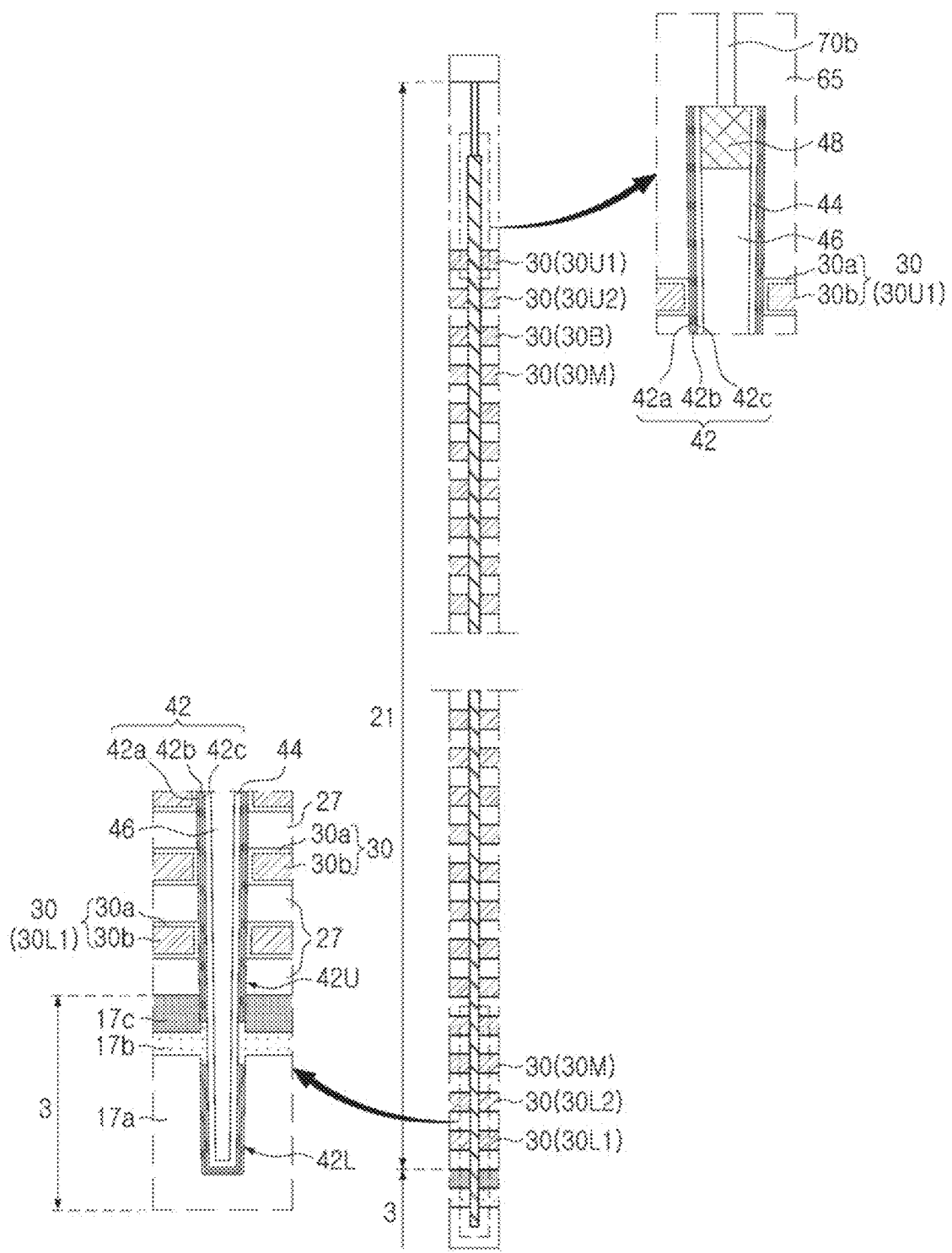
FIG. 4 is an enlarged cross-sectional diagram illustrating portion "B" in FIG. 2A.

In the description below, an example structure of the memory vertical structures 39 described above will be described with reference to FIG. 4. FIG. 4 is an enlarged cross-sectional diagram illustrating portion "B" in FIG. 2A, and the example embodiment will be described based on the memory vertical structure 39.

Referring to FIG. 4, the memory vertical structure 39 may include an insulating gap-fill layer 46, a channel material layer 44 covering an external side surface and a bottom surface of the insulating gap-fill layer 46, a data storage structure 42 covering the external side surface and the bottom surface of the insulating gap-fill layer 46, and a pad material layer 48 on the insulating gap-fill layer 46.

The data storage structure 42 may include a first dielectric layer 42c covering the external side surface and the bottom surface of the channel material layer 44, a data storage material layer 42b covering an external side surface and a bottom surface of the first dielectric layer 42c, and a second dielectric layer 42a covering an external side surface and a bottom surface of the data storage material layer 42b. The first dielectric layer 42c may be in contact with the channel material layer 44, and the data storage material layer 42b may be spaced apart from the channel material layer 44.

The insulating gap-fill layer 46 may include silicon oxide, silicon oxide which may be formed by an atomic layer deposition process, or silicon oxide with voids formed therein, for example.

The second dielectric layer 42a may include silicon oxide or silicon oxide doped with impurities. The first dielectric layer 42c may include at least one of silicon oxide and a high-k dielectric. The data storage material layer 42b may include a material for trapping charges, such as silicon nitride, for example.

The data storage material layer 42b of the data storage structure 42 of the memory vertical structure 39 may include areas for storing data in a semiconductor device such as a flash memory device. The channel material layer 44 may include polysilicon. The pad material layer 48 may include at least one of doped polysilicon, metal nitride (e.g., TiN, or the like), a metal (e.g., W, or the like), and a metal-semiconductor compound (e.g., TiSi, or the like).

The memory vertical structure 39 may penetrate the third pattern layer 17c and the second pattern layer 17b of the pattern structure 17 in order, and may extend into the first pattern layer 17a.

In the pattern structure 17, the second pattern layer 17b may penetrate the data storage structure 42, may isolate the lower portion 42L of the data storage structure 42 from the upper portion 42U the data storage structure 42, and may be in contact with the channel material layer 44.

Figure 5:
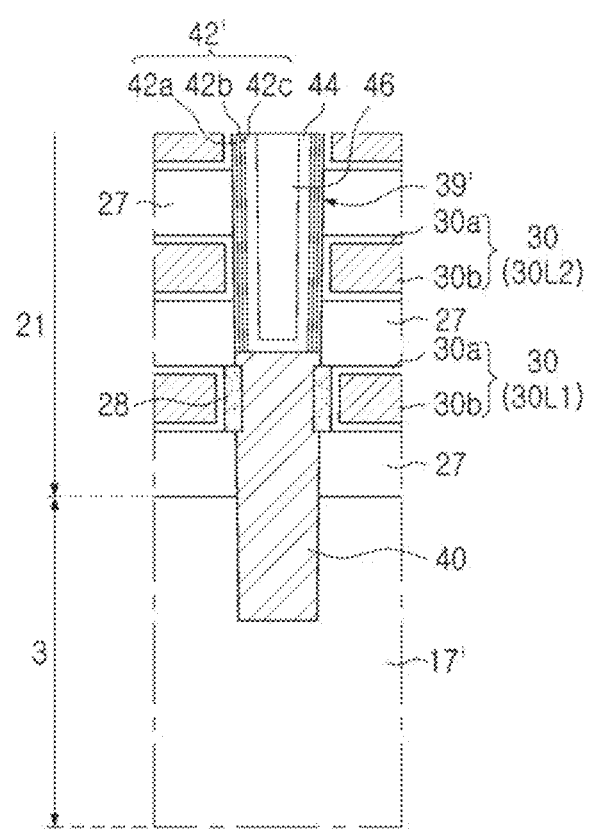
FIG. 5 is an enlarged cross-sectional diagram illustrating a modified example of a portion of a semiconductor device, according to an example embodiment of the present disclosure.

In the description below, a modified example of the memory vertical structure 39 and the pattern structure 17 described in FIG. 4 will be described with reference to FIG. 5. FIG. 5 is an enlarged diagram illustrating a modified example of the memory vertical structure 39 and the stack structure 24 described in the aforementioned example embodiment with reference to FIG. 4.

Referring to FIG. 5, a lower portion of a memory vertical structure 39' may include an epitaxial channel layer 40 including a portion disposed in a pattern structure 17' and having an upper surface disposed on a level higher than an upper surface of the first lower gate layer 30L1 and disposed on a level lower than a lower surface of the second lower gate layer 30L2, an insulating gap-fill layer 46 disposed on the epitaxial channel layer 40, a channel material layer 44 interposed between the insulating gap-fill layer 46 and the epitaxial channel layer 40 and covering a side surface of the insulating gap-fill layer 46, and a data storage structure 42' covering an external side surface of the channel material layer 44. The data storage structure 42' may include a first dielectric layer 42c, a second dielectric layer 42a, and a data storage material layer 42b between the first and second dielectric layers 42c and 42a.

The lower portion of the memory vertical structure 39' may further include a dielectric layer 28 between the first lower gate layer 30L1 and the epitaxial channel layer 40.

Figure 6:
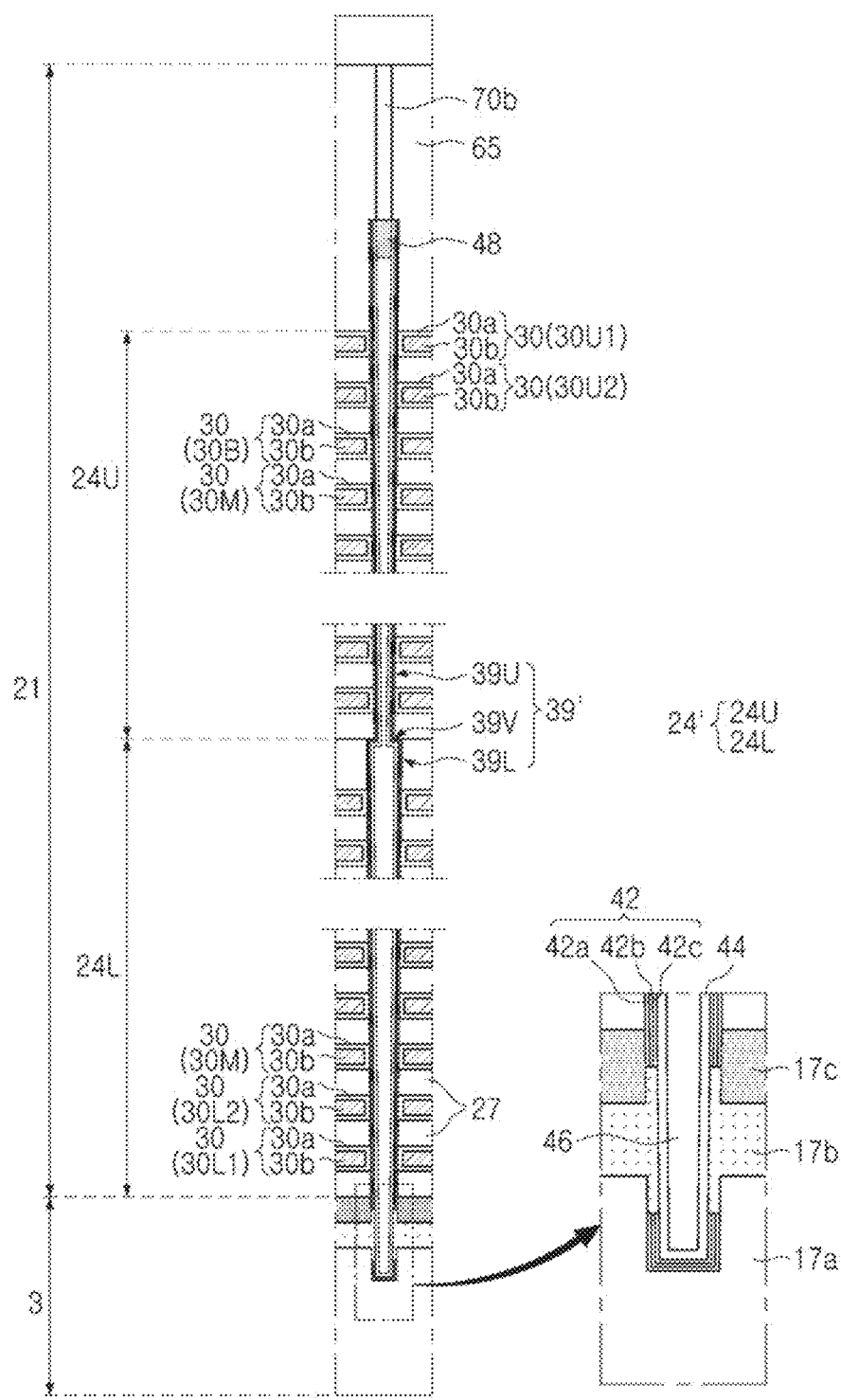
FIG. 6 is an enlarged cross-sectional diagram illustrating a modified example of a portion of a semiconductor device, according to an example embodiment of the present disclosure.

In the description below, a modified example of the memory vertical structure 39 and the stack structure 24 will be described with reference to FIG. 6. FIG. 6 is an enlarged cross-sectional diagram illustrating modified examples of the memory vertical structure 39 and the stack structure 24 illustrated in FIG. 4.

Referring to FIG. 6, the stack structure 24' may include a lower stack structure 24L and an upper stack structure 24U on the lower stack structure 24L.

Each of the lower stack structure 24L and the upper stack structure 24U may include interlayer insulating layers 27 and gate layers 30 alternately stacked. The lower stack structure 24L may include the lower gate layers 30L1 and 30L2 described above, and the upper stack structure 24U may include the upper gate layers 30U1 and 30U2 described above.

The memory vertical structure 39' may include a lower vertical portion 39L penetrating the lower stack structure 24L and an upper vertical portion 39U penetrating the upper stack structure 24U.

In an example embodiment, a width of an upper area of the lower vertical portion 39L may be different from a width of a lower area of the upper vertical portion 39U. For example, a width of the upper area of the lower vertical portion 39L may be greater than a width of the lower area of the upper vertical portion 39U.

In an example embodiment, a side surface of the lower vertical portion 39L and a side surface of the upper vertical portion 39U, adjacent to each other, may not be aligned in the vertical direction Z.

In an example, on a level between an uppermost gate layer among the gate layers 30 of the lower stack structure 24L and a lowermost gate layer among the gate layers 30 of the upper stack structure 24U, a side surface of the memory vertical structure 39' may include a bent portion.

Figure 7A:
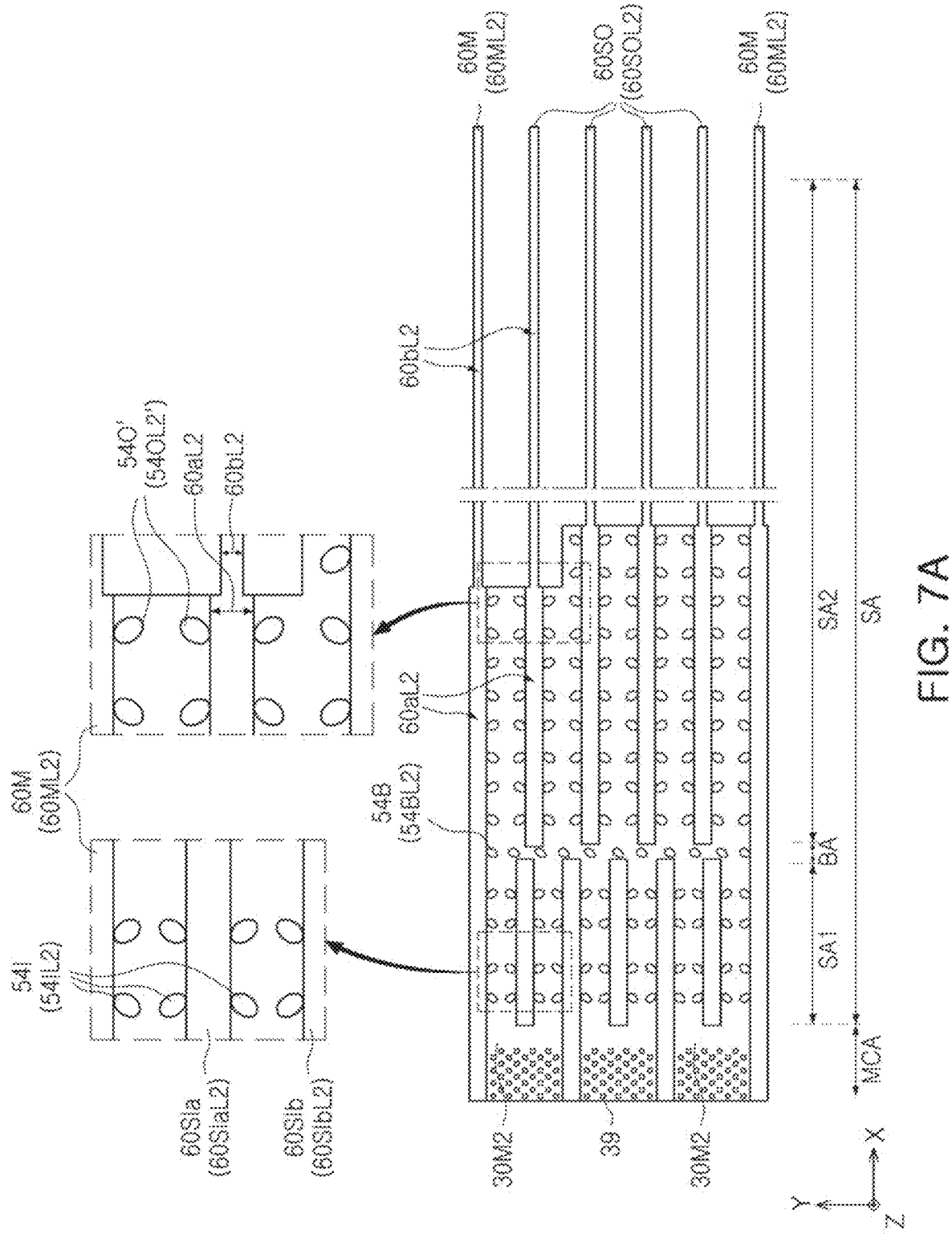
FIG. 7A is an enlarged plan diagram illustrating a modified example of a portion of a semiconductor device, according to an example embodiment of the present disclosure.
Figure 7B:
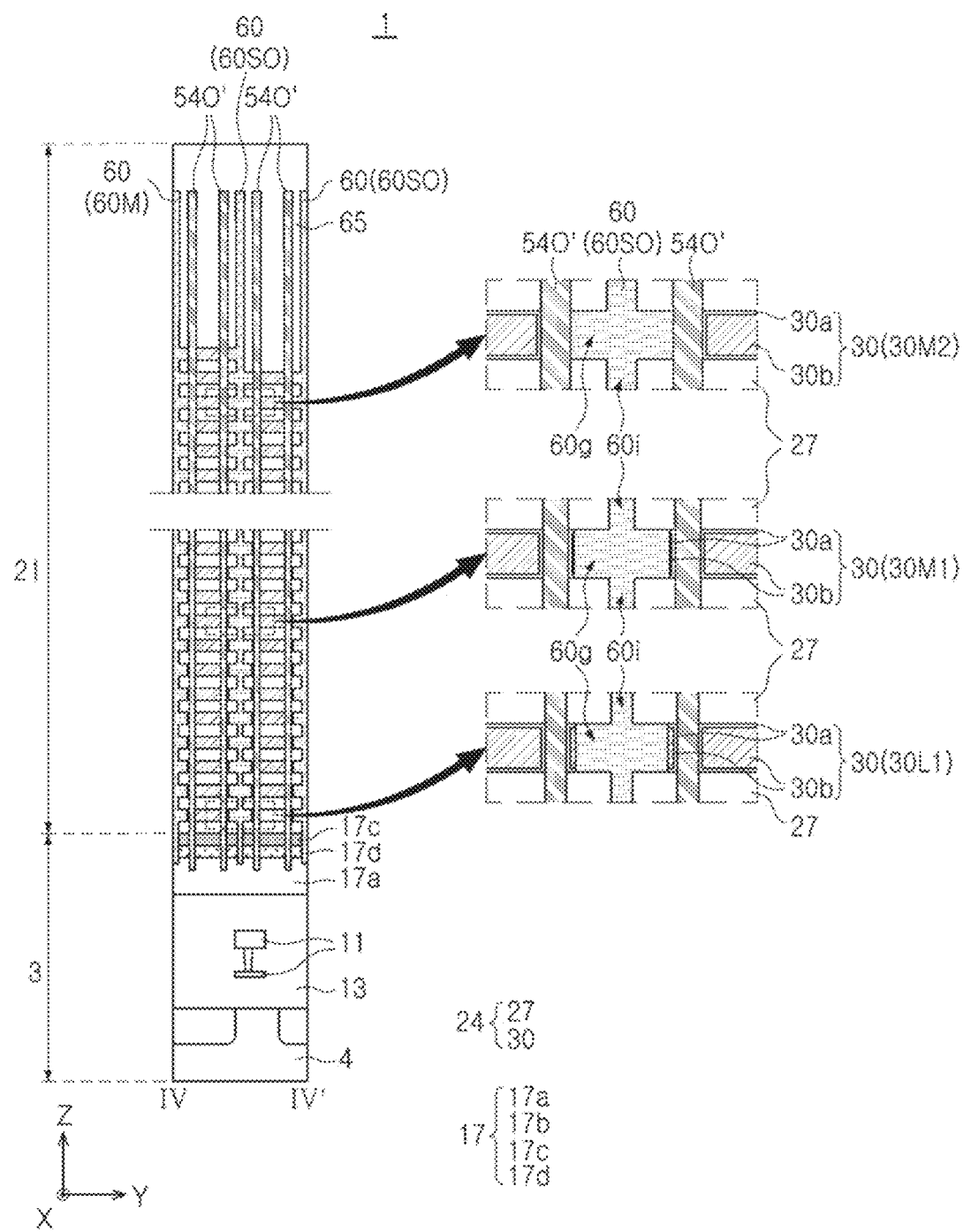
FIG. 7B is a cross-sectional diagram illustrating a modified example of a portion of a semiconductor device, according to an example embodiment of the present disclosure.

As described above, the outer support vertical structures 54O may be spaced apart from the main separation structures 60M and the outer separation structures 60SO, but an example embodiment thereof is not limited thereto. For example, at least a portion of the outer support vertical structures 54O may be in contact with one of the adjacent main separation structures 60M and the adjacent outer separation structures 60SO. An example embodiment in which at least a portion of the outer support vertical structures 54O may be in contact with one of the adjacent main separation structures 60M and the adjacent outer separation structures 60SO as described above will be described with reference to FIGS. 7A and 7B. FIG. 7A is a plan diagram illustrating a planar shape on the same level as the second intermediate gate layer 30M2 as in FIG. 3B, and FIG. 7B is a cross-sectional diagram illustrating a modified example of the cross-sectional structure taken along line IV-IV' in FIG. 2D. A modified example of the example illustrated in FIGS. 3B and 2D will be mainly described with reference to FIGS. 7A and 7B, and the descriptions of the other elements will not be repeated.

In a modified example, referring to FIGS. 7A and 7B, at least a portion of the outer support vertical structures 54O' may be in contact with one of the adjacent main separation structures 60M and the adjacent outer separation structures 60SO. For example, on the level on which the second intermediate gate layer 30M2 is disposed, at least one of the portions 54OL2' of the outer support vertical structures 54O' may be in contact with one of the portions 60SOL2 of the adjacent main separation structures 60M and the adjacent outer separation structures 60SO.

As in FIG. 7B, on the levels on which the first intermediate gate layer 30M1 and the first lower gate layer 30L1 are disposed, portions of the outer support vertical structures 54O' may be spaced apart from portions of the adjacent main separation structures 60M and the adjacent outer separation structures 60SO.

Figure 8A:
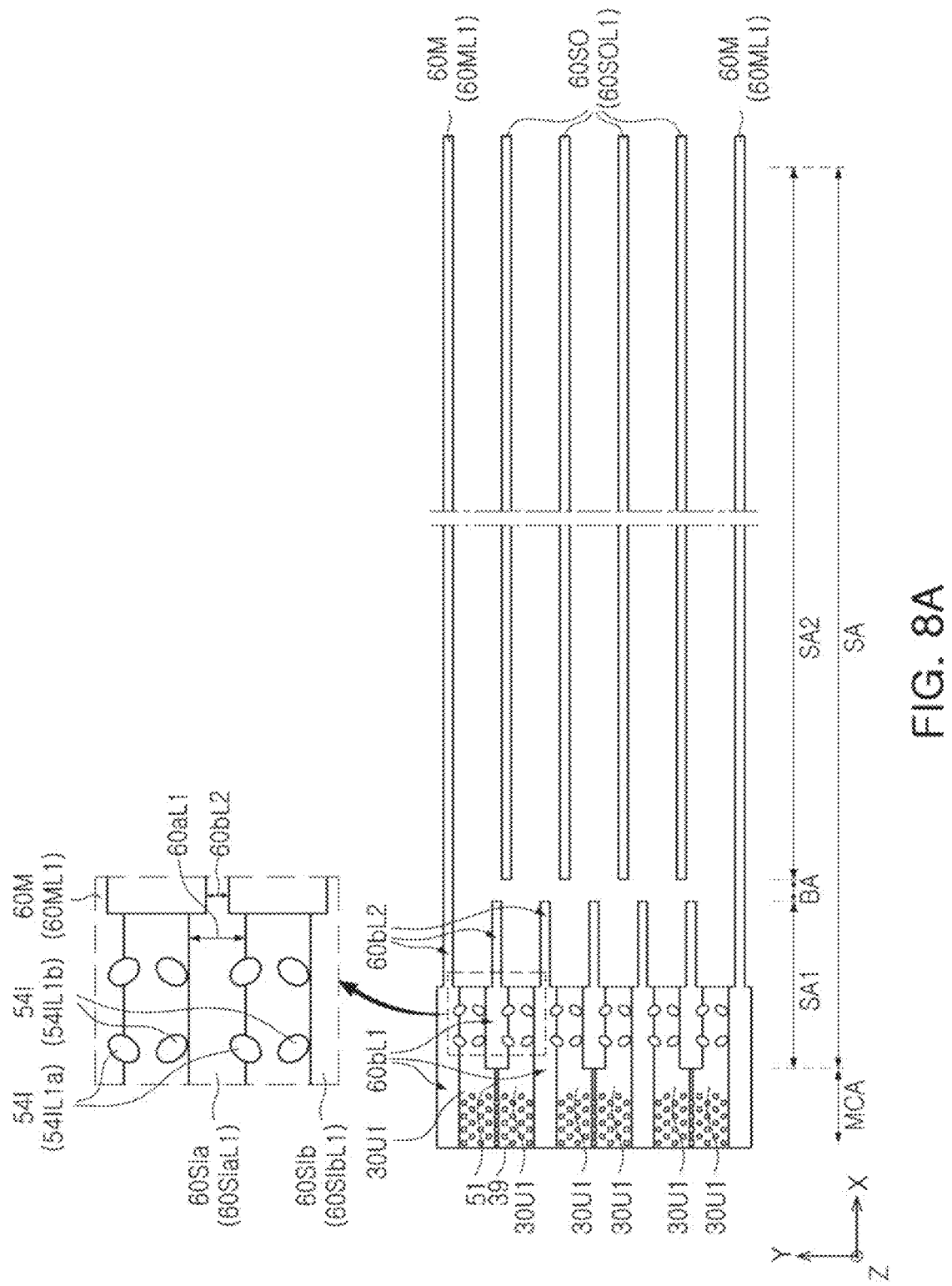
FIG. 8A is an enlarged plan diagram illustrating a modified example of a portion of a semiconductor device, according to an example embodiment of the present disclosure.
Figure 8B:
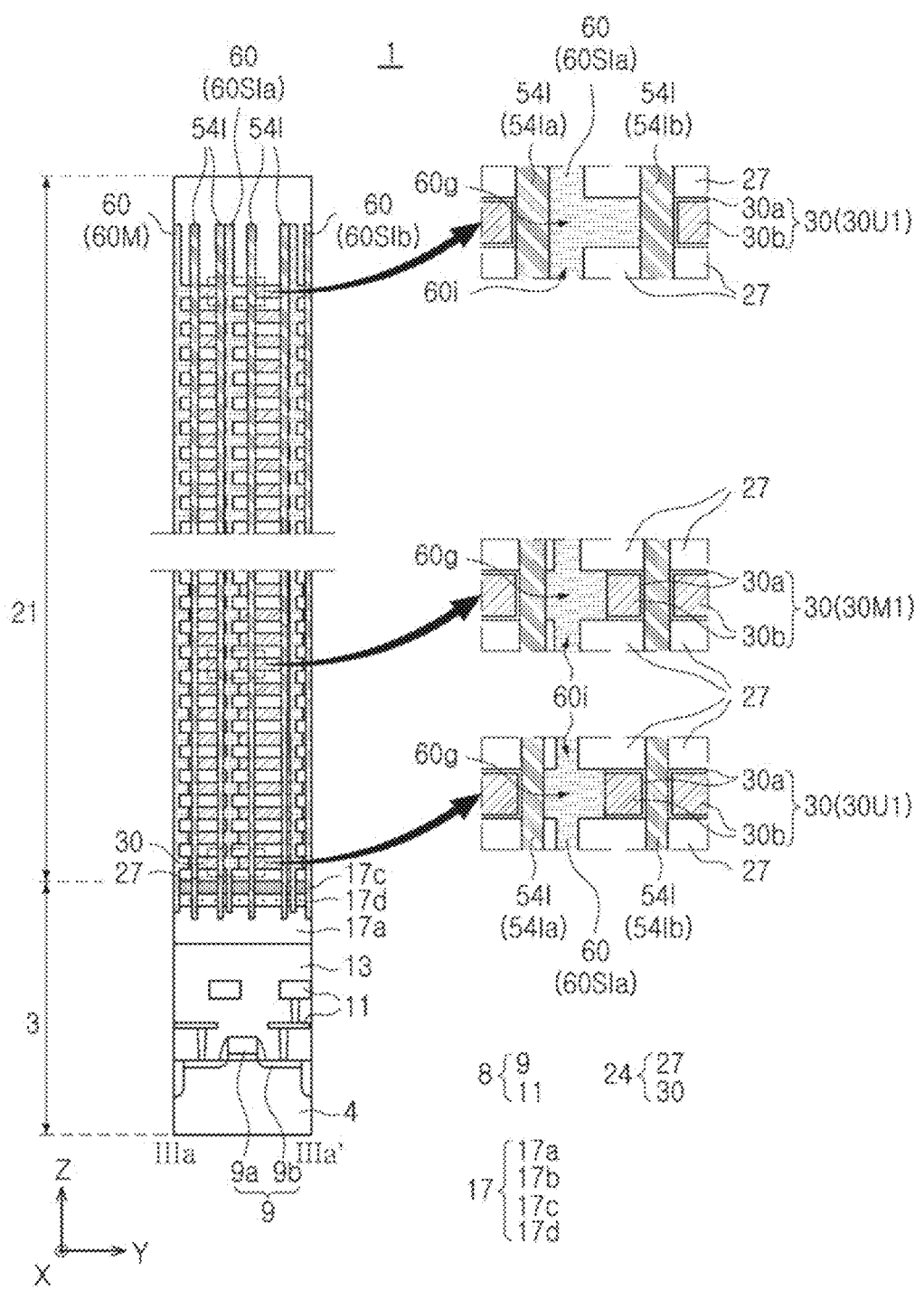
FIG. 8B is a cross-sectional diagram illustrating a modified example of a semiconductor device, according to an example embodiment of the present disclosure.

In the description below, a modified example of the above-described inner support vertical structures 54I will be described with reference to FIGS. 8A and 8B. FIG. 8A is a plan diagram illustrating a planar shape on the same level as the first upper gate layer 30U1 as in FIG. 3A, and FIG. 8B is a cross-sectional diagram illustrating a modified example of the cross-sectional structure taken along line IIIa-IIIa' in FIG. 2C. In the description below, a modified example of the example in FIGS. 3A and 2C will be mainly described or the other elements will be directly referred.

In the modified example, referring to FIGS. 8A and 8B, in inner support vertical structures 54I, a center of one of the main separation structures 60M and the inner separation structures 60SIa and 60SIb, a center of the inner support vertical structure 54Ia of a pair of the inner support vertical structures 54Ia and 54Ib disposed on both sides of the inner separation structures 60SIa, may be more adjacent to a center of the inner separation structures 60SIa than a center of the other inner support vertical structure 54Ib. For ease of description, in FIG. 8B, the inner support vertical structure 54Ia disposed on the left side of the first inner separation structure 60SIa will be referred to as a first support vertical structure, and the inner support vertical structure 54Ib disposed on the right side of the first inner separation structure 60SIa will be referred to as a second support vertical structure.

A distance between the center of the first inner separation structure 60SIa and the center of the first support vertical structure 54Ia may be less than a distance between the center of the first inner separation structure 60SIa and the center of the second support vertical structure 54Ib.

A distance between the center of the first inner separation structure 60SIa and the center of the first support vertical structure 54Ia may be greater in a lower area (e.g., an area at a relatively lower level in the vertical direction Z) than in an upper area (e.g., an area at a relatively higher level in the vertical direction Z).

A distance between the center of the first inner separation structure 60SIa and the center of the second support vertical structure 54I*b* may be greater in a lower area than in an upper area.

The first inner separation structure 60SIa and the second support vertical structure 54I*b* may be in contact with each other on an upper vertical level, and may be spaced apart from each other on an intermediate or lower vertical level. For example, on the same level as the first upper gate layer 30U1, the first inner separation structure 60SIa and the second support vertical structure 54I*b* may be in contact with each other, and on the same levels as the first intermediate gate layer 30M1 and the first lower gate layer 30L1, the first inner separation structure 60SIa and the second support vertical structure 54I*b* may be spaced apart from each other.

In the first support vertical structure 54I*a*, the first inner separation structure 60SIa may be in contact with the first support vertical structure 54Ia on levels on which from the first lower gate layer 30L1 to the first upper gate layer 30U1 are disposed.

In example embodiments, on the level on which the gate layers 30 are disposed, the first inner separation structure 60SIa and the first support vertical structure 54Ia may be in contact with each other, and on the other level, the level on which the interlayer insulating layers 27 are disposed, for example, the first inner separation structure 60SIa and the first support vertical structure 54Ia may be spaced apart from each other.

As in FIG. 8A, on the level on which the first upper gate layer 30U1 is disposed, first and second support portions 54IL1*a* and 54IL1*b* of the inner support vertical structures 54I may include one of the portions 60ML1 of the main separation structures 60M and the isolation portions 60SIaL1 and 60SIbL1 of the inner separation structures 60SIa and 60SIb, for example, first and second support portions 54IL1*a* and 54IL1*b* disposed on both sides of the isolation portion 60SIaL1. A contact area between the first support portion 54IL1*a* and the isolation portion 60SIaL1 may be larger than a contact area between the second support portion 54IL1*b* and the isolation portion 60SIaL1.

Figure 9A:
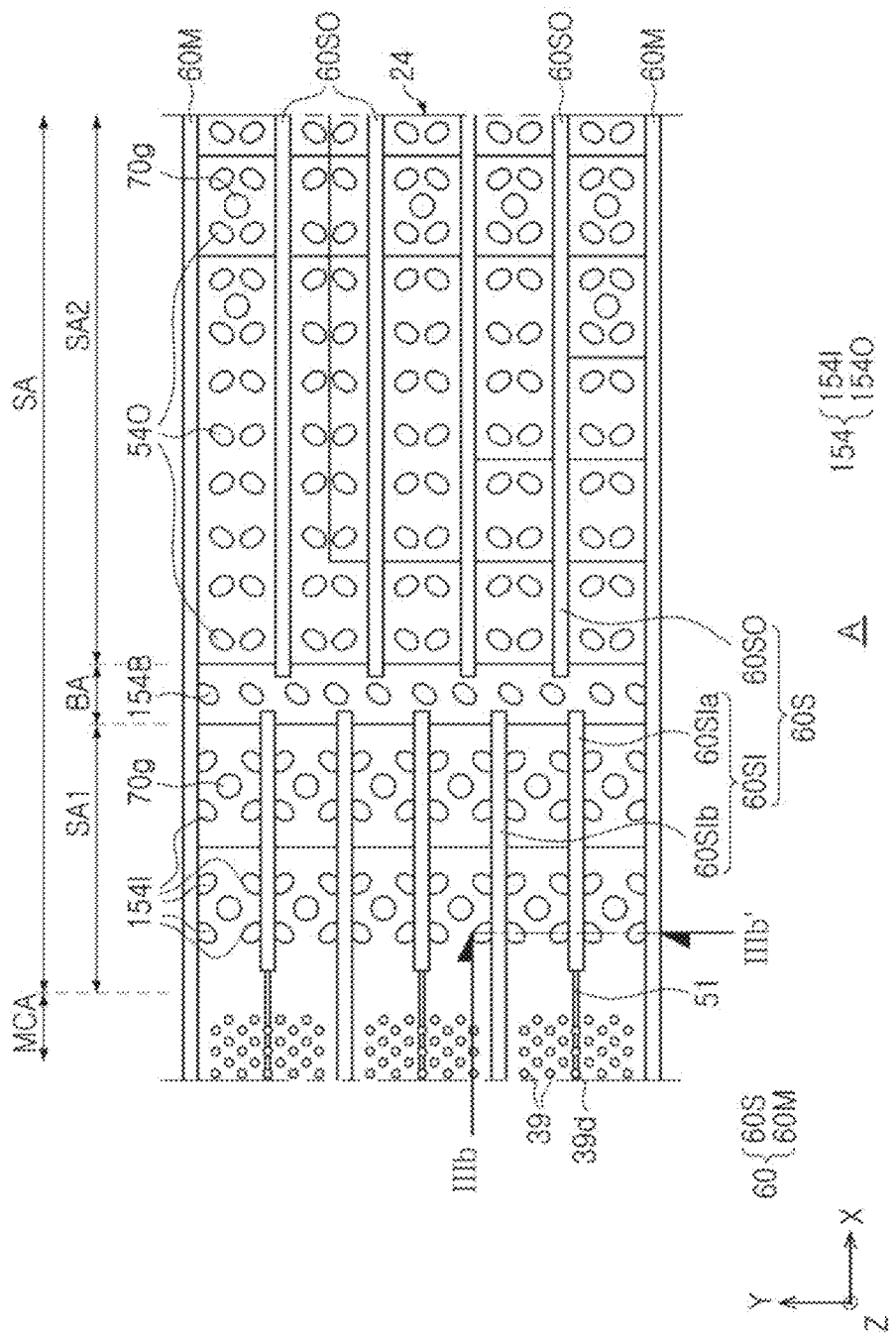
FIG. 9A is a plan diagram illustrating a modified example of a portion of a semiconductor device, according to an example embodiment of the present disclosure.
Figure 9B:
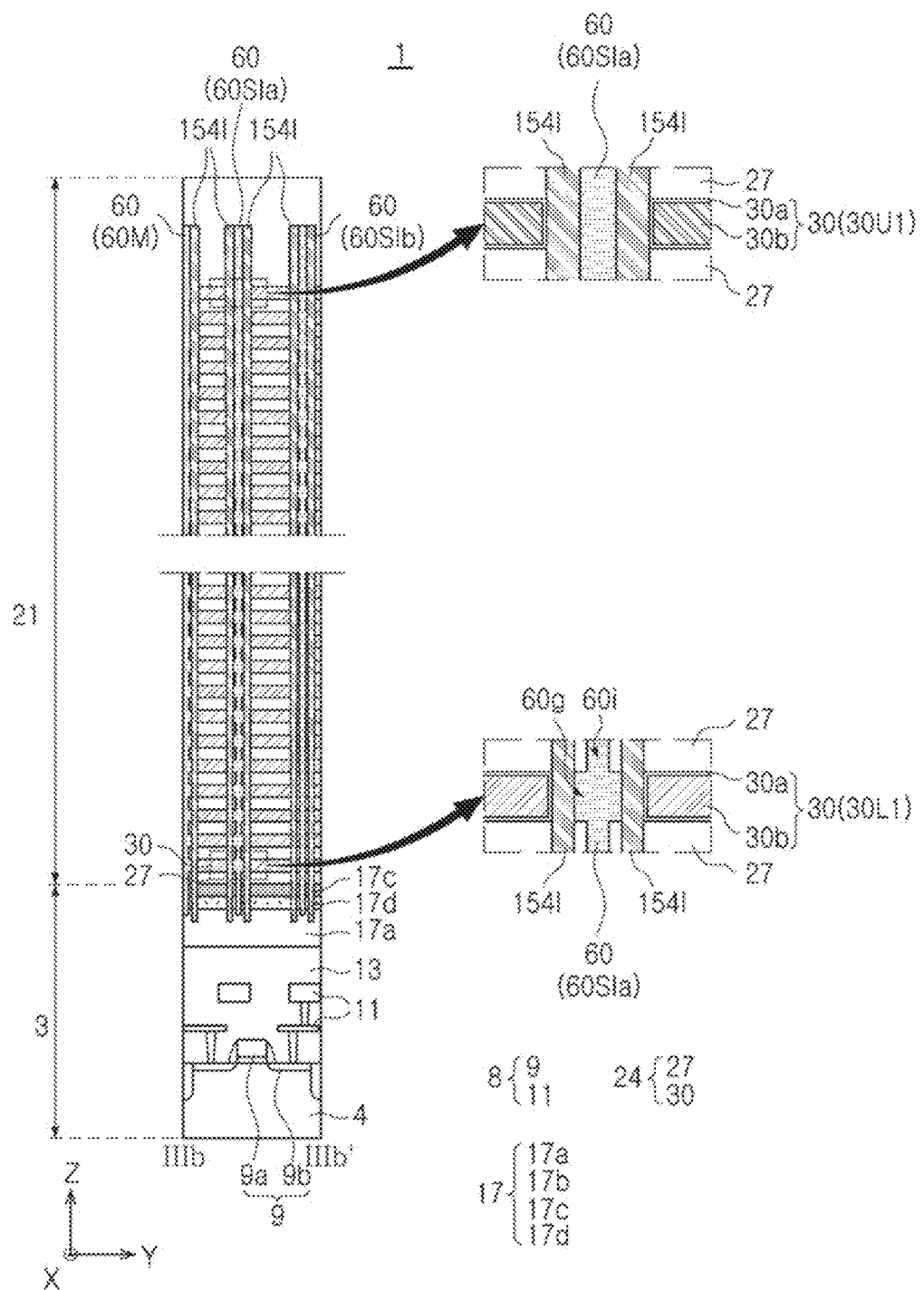
FIG. 9B is a cross-sectional diagram illustrating a modified example of a semiconductor device, according to an example embodiment of the present disclosure.

In the description below, a modified example of the above-described inner support vertical structures 54I will be described with reference to FIGS. 9A and 9B. FIG. 9A is a diagram illustrating a modified example of the inner support vertical structures 54I in the enlarged plan diagram in FIG. 2B. FIG. 9B is a cross-sectional diagram illustrating an area taken along line in FIG. 9A. FIG. 9B may be a cross-sectional diagram illustrating an example in which the inner support vertical structures 54I are modified to form inner support vertical structure 154I in the cross-sectional structure in FIG. 2C. In the description below, a modified example of the examples in FIGS. 1B and 2C will be mainly described with reference to FIGS. 9A and 9B, and the descriptions of the other elements will not be provided or the other elements will be directly referred.

In a modified example, referring to FIGS. 9A and 9B, on a level higher than the first upper gate layer 30U1, the inner support vertical structures 154I may be in contact with an adjacent separation structure among the main separation structures 60M and the inner separation structures 60SIa and 60SIb.

In an example, on a level lower than the first upper gate layer 30U1, the inner support vertical structures 154I may be in contact with an adjacent separation structure among the main separation structures 60M and the inner separation structures 60SIa and 60SIb.

In an example, a plane as in FIG. 9A, on a level higher than the first upper gate layer 30U1, for example, the main separation structures 60M and the inner separation structures 60SIa and 60SIb may have a shape of partially cutting out the adjacent inner support vertical structures 154I. Accordingly, at least one of the inner support vertical structures 154I may have a linear-shaped side surface in contact with an adjacent separation structure among the main separation structures 60M and the inner separation structures 60SIa and 60SIb and a side surface not in contact with the separation structure and forming a curved surface.

In the example embodiments described above with reference to FIGS. 1A to 9B, the semiconductor substrate 4 and the peripheral circuit 8 described with reference to FIGS. 2A to 2E may be disposed below the stack structure 24. However, an example embodiment thereof is not limited thereto. For example, the semiconductor substrate 4 and the peripheral circuit 8 described with reference to FIGS. 2A to 2E may be disposed above the stack structure 24. In the description below, an example in which the semiconductor substrate 4 and the peripheral circuit 8 described with reference to FIGS. 2A to 2E are disposed above the stack structure 24 will be described with reference to FIG. 10. Although the elements such as the separation structures 60 and the support vertical structures 54 penetrating the stack structure 24 described with reference to FIGS. 1A to 9B are not described, the modified example described with reference to FIG. 10 may include the elements such as the separation structures 60 and the support vertical structures 54 described in the aforementioned example embodiments with reference to FIGS. 1A to 9B.

Figure 10:
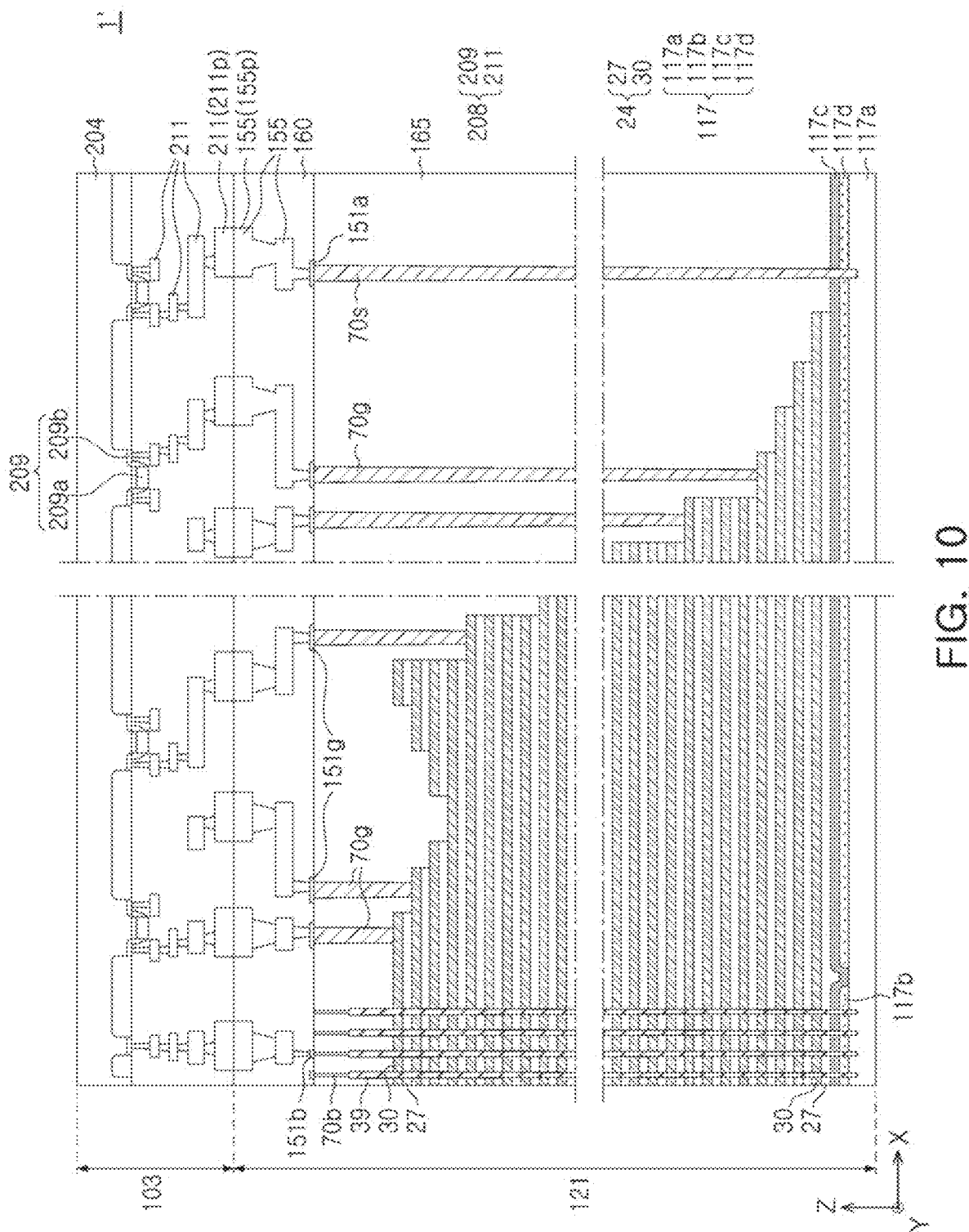
FIG. 10 is a cross-sectional diagram illustrating a modified example of a semiconductor device, according to an example embodiment of the present disclosure.

In the modified example, referring to FIG. 10, a semiconductor device 1' according to an example embodiment may include a lower structure 121 and an upper structure 103 stacked in the vertical direction Z.

The lower structure 121 may be referred to as a second structure, and the upper structure 103 may be referred to as a first structure.

The lower structure 121 may include the stack structure 24, the memory vertical structures 39, the bit line contact plugs 70*b*, and the gate contact plugs 70*g*, and the source contact plug 70*s* described in the aforementioned example embodiment with reference to FIGS. 1A to 2E.

The lower structure 121 may further include a pattern structure 117. The pattern structure 117 may be substantially the same as the pattern structure 17 described in the aforementioned example embodiment with reference to FIGS. 1A to 2E. For example, the pattern structure 117 may include first to fourth pattern layers 117a-117d corresponding to the first to fourth pattern layers 17a-17d, respectively, described in the aforementioned example embodiment with reference to FIGS. 1A to 2E. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

The lower structure 121 may cover the stack structure 24 on the pattern structure 117, and may further include an upper insulating layer 165. The upper insulating layer 165 may be substantially the same as the upper insulating layer 65 described in the aforementioned example embodiment with reference to FIGS. 2A to 2E.

The lower structure 121 may further include bit lines 151b electrically connected to the bit line contact plugs 70b on the bit line contact plugs 70b, gate interconnection lines 151g electrically connected to the gate contact plugs 70g on the gate contact plugs 70g, and a source contact wiring 151a electrically connected to the source contact plug 70s on the source contact plug 70s.

The lower structure 121 may include a capping insulating structure 160 on the upper insulating layer 65, and a lower bonding interconnection structure 155 electrically connected to the bit lines 151b, the gate interconnection lines 151g, and the source contact wiring 151a. The lower bonding interconnection structure 155 may include lower bonding pads 155p.

The upper structure 103 may include a semiconductor substrate 204, a peripheral circuit 209 disposed between the semiconductor substrate 204 and the lower structure 121, and an upper bonding interconnection structure 211 electrically connected to the peripheral circuit 209 between the peripheral circuit 209 and the lower structure 121. The upper bonding interconnection structure 211 may include upper bonding pads 211p. The peripheral circuit 209 may be a transistor including a peripheral gate 209a and a peripheral source/drain 209b. The lower bonding pads 155p of the lower bonding interconnection structure 155 may be in contact with the upper bonding pads 211p of the upper bonding interconnection structure 211. The lower bonding pads 155p may be bonded to the upper bonding pads 211p of the upper bonding interconnection structure 211. The lower bonding pads 155p and the upper bonding pads 211p may include a copper material.

Figure 11:
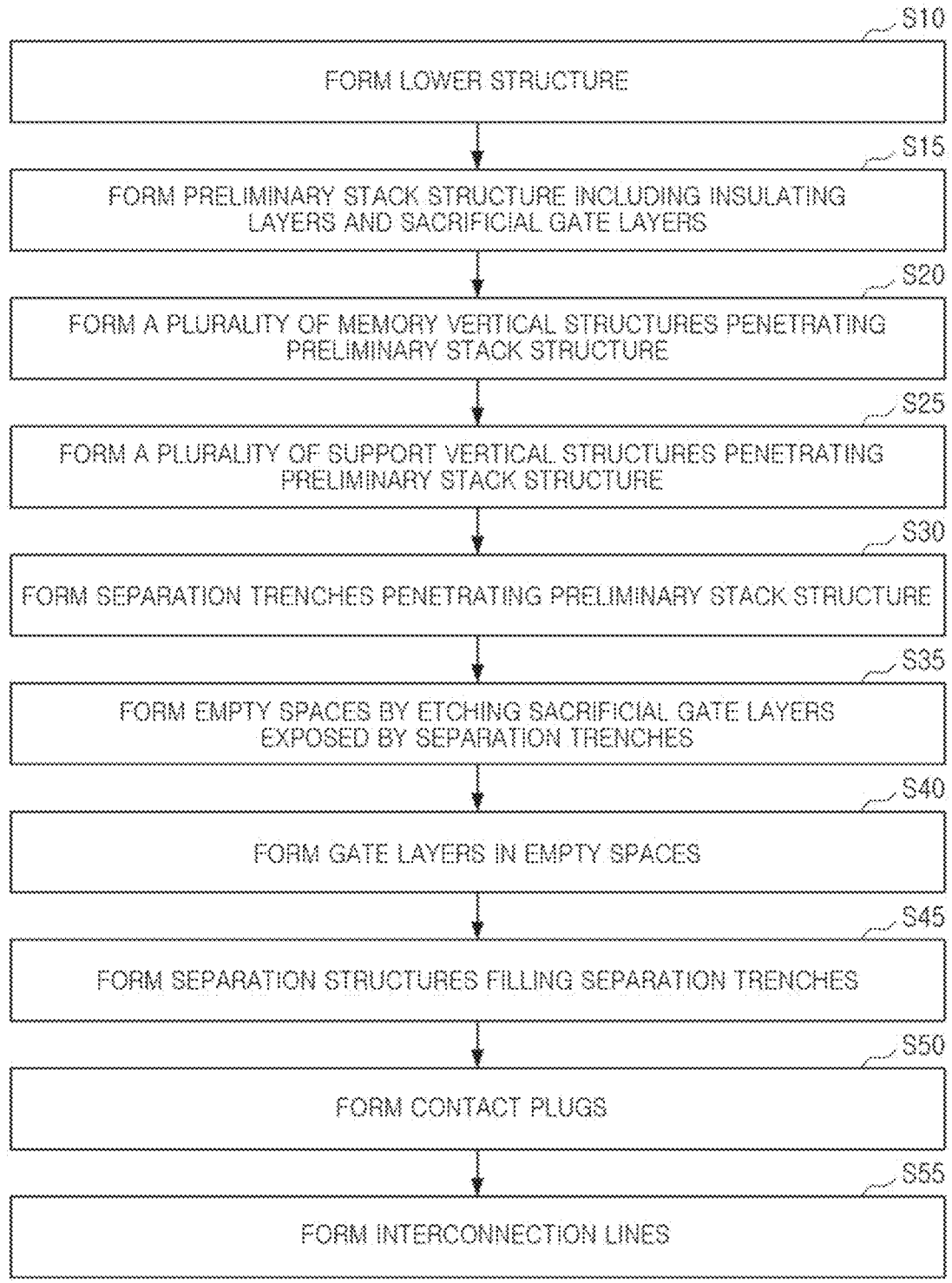
FIG. 11 is a flowchart illustrating processes of a method of manufacturing a semiconductor device, according to an example embodiment of the present disclosure.

In the description below, an example embodiment of a method of manufacturing a semiconductor device in an example embodiment will be described with reference to FIG. 11. FIG. 11 is a flowchart illustrating processes of a method of manufacturing a semiconductor device according to an example embodiment.

Referring to FIG. 11, a lower structure may be formed (S10). For example, the lower structure may be the first structure 3 described in the aforementioned example embodiment with reference to FIGS. 2A to 2E.

A preliminary stack structure including insulating layers and sacrificial gate layers may be formed (S15). For example, the insulating layers may be the interlayer insulating layers 27 described in the aforementioned example embodiment with reference to FIGS. 2A to 2E, and the sacrificial gate layers may be mold layers for forming the gate layers 30 described in the aforementioned example embodiment with reference to FIGS. 2A to 2E. The preliminary stack structure may be formed in substantially the same shape as that of the stack structure 24 described in the aforementioned example embodiment with reference to FIGS. 1A to 2E.

A plurality of memory vertical structures penetrating the preliminary stack structure may be formed (S20). For example, the plurality of memory vertical structures may be the plurality of memory vertical structures 39 in FIGS. 1A to 2E.

A plurality of support vertical structures penetrating the preliminary stack structure may be formed (S25). For example, the plurality of support vertical structures may be the plurality of support vertical structures 54 described in the aforementioned example embodiment with reference to FIGS. 1A to 2E.

Separation trenches penetrating the preliminary stack structure may be formed (S30). Empty spaces may be formed by etching the sacrificial gate layers exposed by the separation trenches (S35). Gate layers may be formed in the empty spaces (S40). For example, the gate layers may be the gate layers 30 described in FIGS. 1A to 2E.

Separation structures filling the separation trenches may be formed (S45). In process S40 described above, the gate layers may not completely fill the empty spaces. Accordingly, the separation structures may fill the separation trenches and may fill the other portions of the empty spaces. The separation structures may be the separation structures 60 described in the aforementioned example embodiment with reference to FIGS. 1A to 2E.

Contact plugs may be formed (S50). For example, the contact plugs may be the bit line contact plugs 70b, the gate contact plugs 70g, the source contact plugs 70s, and the peripheral contact plugs 70p described in FIGS. 1A to 2E.

Interconnection lines may be formed (S55). For example, the interconnection lines may be bit lines electrically connected to the bit line contact plugs 70b, which may be, for example, bit lines 151b in FIG. 10, gate interconnection lines electrically connected to the gate contact plugs 70g, which may be, for example, the gate interconnection lines 151g in FIG. 10, and a source interconnection line electrically connected to the source contact plug 70s, which may be, for example, the source contact wiring 151a in FIG. 10.

In the description below, a data storage system including a semiconductor device according to an example embodiment will be described with reference to FIGS. 12, 13, and 14.

Figure 12:
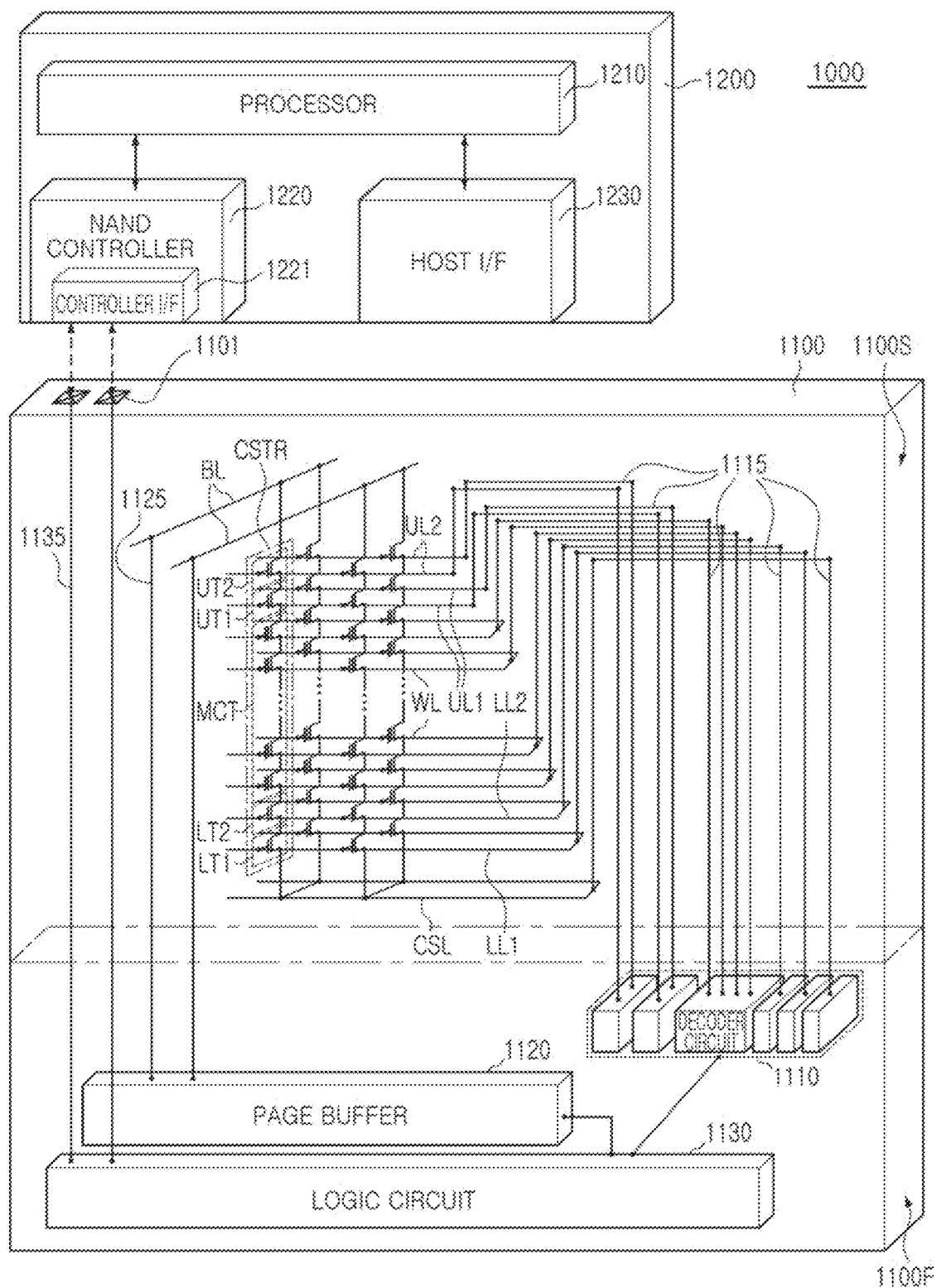
FIG. 12 is a diagram illustrating a data storage system including a semiconductor device, according to an example embodiment of the present disclosure.

FIG. 12 is a diagram illustrating a data storage system including a semiconductor device according to an example embodiment.

Referring to FIG. 12, a data storage system 1000 according to an example embodiment may include a semiconductor device 1100 and a controller 1200 electrically connected to the semiconductor device 1100. The data storage system 1000 may be a storage device including the semiconductor device 1100 or an electronic device including a storage device. For example, the data storage system 1000 may be a solid state drive device (SSD) device including the semiconductor device 1100, a universal serial bus (USB), a computing system, a medical device, or a communication device.

In an example embodiment, the data storage system 1000 may be an electronic system for storing data.

The semiconductor device 1100 may be the semiconductor device described in one of the aforementioned example embodiments described with reference to FIGS. 1A to 10. The semiconductor device 1100 may include a first structure 1100F and a second structure 1100S on the first structure 1100F.

The first structure 1100F may be configured as a peripheral circuit structure including a decoder circuit 1110, a page buffer 1120, and a logic circuit 1130. For example, the first structure 1100F may include the peripheral circuit (the peripheral circuit 8 in FIG. 2A or the upper bonding interconnection structure 211 in FIG. 10).

The second structure 1100S may be configured as a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

The pattern structure 17 (in FIGS. 1A to 2E) described above may include a silicon layer having N-type conductivity, and the silicon layer having N-type conductivity may be the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be varied in example embodiments.

In example embodiments, the upper transistors UT1 and UT2 may include string select transistors, and the lower transistors LT1 and LT2 may include ground select transistors. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

The gate layers 115g described above may form the gate lower lines LL1 and LL2, the word lines WL, and gate upper lines UL1 and UL2.

In example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistors LT1 and the upper erase control transistor UT1 may be used in an erase operation for erasing data stored in the memory cells using a gate induce drain leakage (GIDL) phenomenon.

The common source line CSL, the first and second gate lower lines LL1 and LL2, word lines WL, and the first and second gate upper lines UL1 and UL2 may be electrically connected to the decoder circuit 1110 through first connection wirings 1115 extending from the first structure 1100F to the second structure 1100S.

In example embodiments, the lower gate layers 30L1 and 30L2 (in FIG. 2A) described above may be the gate lower lines LL1 and LL2, and the upper gate layers 30U1 and 30U2 (in FIG. 2A) may be the gate upper lines UL1 and UL2. A several number of the intermediate gate layers 30M (in FIG. 2A) may be the word lines WL.

The bit lines BL may be electrically connected to the page buffer 1120 through second connection wirings 1125 extending from the first structure 1100F to the second structure 1100S. The bit lines BL may be electrically connected to the bit line contact plugs 70b (in FIG. 2A) described above.

In the first structure 1100F, the decoder circuit 1110 and the page buffer 1120 may perform a control operation on at least one select memory cell transistor among the plurality of memory cell transistors MCT. The decoder circuit 1110 and the page buffer 1120 may be controlled by a logic circuit 1130. The semiconductor device 1100 may communicate with the controller 1200 through the input/output pads 1101 electrically connected to the logic circuit 1130. The input/output pads 1101 may be electrically connected to the logic circuit 1130 through an input/output connection wiring 1135 extending from the first structure 1100F to the second structure 1100S.

The controller 1200 may include a processor 1210, a NAND controller 1220, and a host interface 1230. In example embodiments, the data storage system 1000 may include a plurality of semiconductor devices 1100, and in this case, the controller 1200 may control the plurality of semiconductor devices 1100.

The processor 1210 may control overall operation of the data storage system 1000 including the controller 1200. The processor 1210 may operate according to a predetermined firmware, and may access the semiconductor device 1100 by controlling the NAND controller 1220. The NAND controller 1220 may include a NAND interface 1221 for processing communication with the semiconductor device 1100. Through the NAND interface 1221, a control command for controlling the semiconductor device 1100, data to be written in the memory cell transistors MCT of the semiconductor device 1100, and data to be read from the memory cell transistors MCT may be transmitted. The host interface 1230 may provide a communication function between the data storage system 1000 and an external host. When a control command is received from an external host through the host interface 1230, the processor 1210 may control the semiconductor device 1100 in response to the control command.

Figure 13:
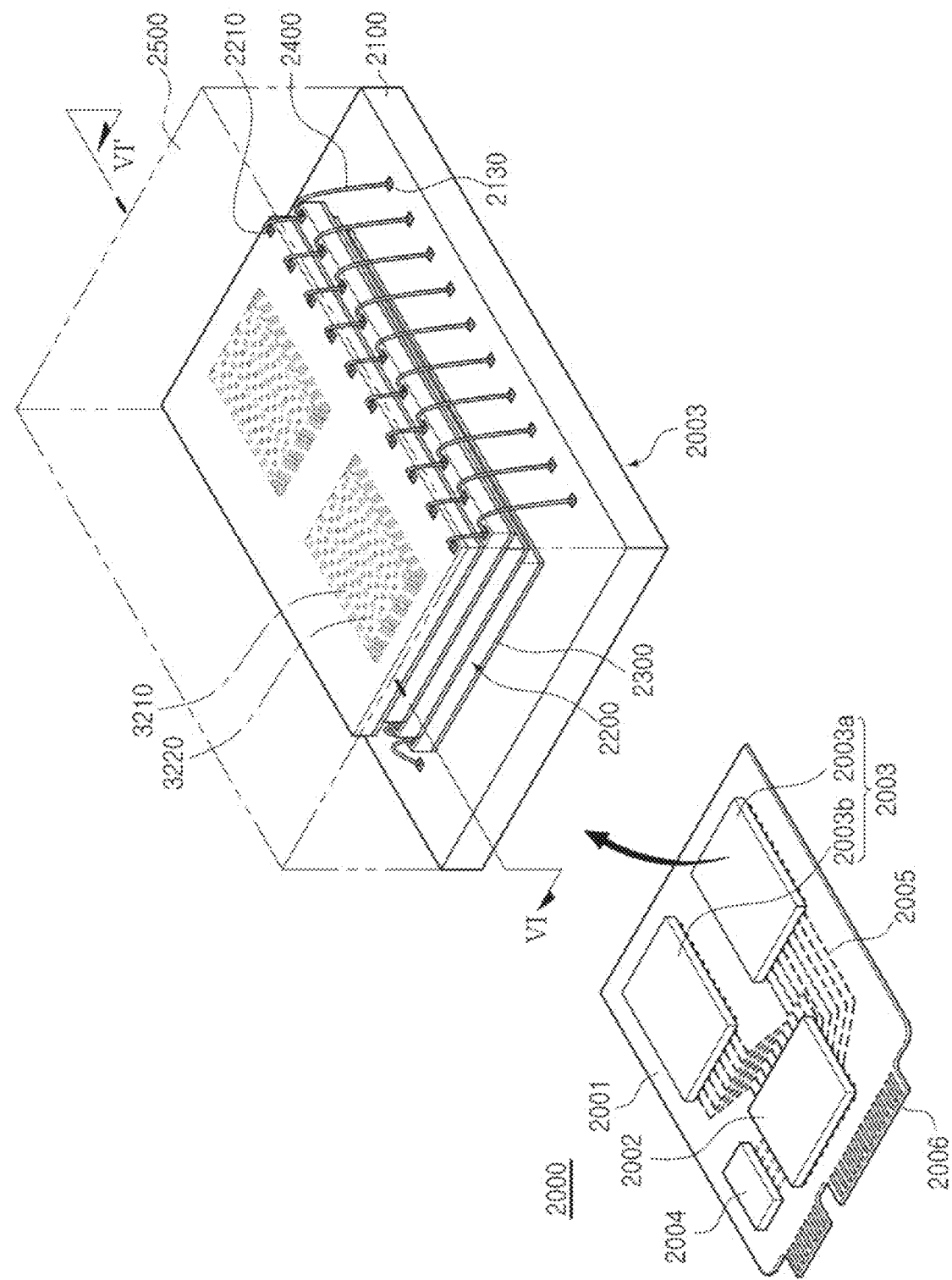
FIG. 13 is a perspective diagram illustrating a data storage system including a semiconductor device, according to an example embodiment of the present disclosure.

FIG. 13 is a perspective diagram illustrating a data storage system including a semiconductor device according to an example embodiment.

Referring to FIG. 13, a data storage system 2000 according to an example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number and the arrangement of the plurality of pins in the connector 2006 may be varied depending on a communication interface between the data storage system 2000 and the external host. In example embodiments, the data storage system 2000 may communicate with the external host through one of a universal serial bus (USB), a peripheral component interconnect express (PCI-Express), a serial advanced technology attachment (SATA), and an M-phy for universal flash storage (UFS). In example embodiments, the data storage system 2000 may operate by power supplied from the external host through the connector 2006. The data storage system 2000 may further include a power management integrated circuit (PMIC) for distributing power supplied from the external host to the controller 2002 and the semiconductor package 2003.

The controller 2002 may write data in the semiconductor package 2003 or may read data from the semiconductor package 2003, and may improve an operation speed of the data storage system 2000.

The DRAM 2004 may be configured as a buffer memory for mitigating a difference in speeds between the semiconductor package 2003, a data storage space, and an external host. The DRAM 2004 included in the data storage system 2000 may also operate as a cache memory, and may provide a space for temporarily storing data in a control operation for the semiconductor package 2003. When the DRAM 2004 is included in the data storage system 2000, the controller 2002 further may include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the semiconductor chips 2200 may include a semiconductor device described in one of the aforementioned example embodiments described with reference to FIGS. 1A to 10.

Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including package upper pads 2130. Each of the semiconductor chips 2200 may include an input/output pad 2210.

In example embodiments, the connection structure 2400 may be a bonding wire electrically connecting the input/output pad 2210 to the package upper pads 2130. Accordingly, in each of the first and second semiconductor packages 2003a and 2003b, the semiconductor chips 2200 may be electrically connected to each other through a bonding wire method, and may be electrically connected to the package upper pads 2130 of the package substrate 2100. In example embodiments, in each of the first and second semiconductor packages 2003a and 2003b, the semiconductor chips 2200 may be electrically connected to each other by a connection structure (e.g., a through silicon via (TSV)), instead of the connection structure 2400 of a bonding wire method.

In example embodiments, the controller 2002 and the semiconductor chips 2200 may be included in a single package. For example, the controller 2002 and the semiconductor chips 2200 may be mounted on a separate interposer substrate different from the main substrate 2001, and the controller 2002 may be connected to the semiconductor chips 2200 by wirings formed on the interposer substrate.

Figure 14:
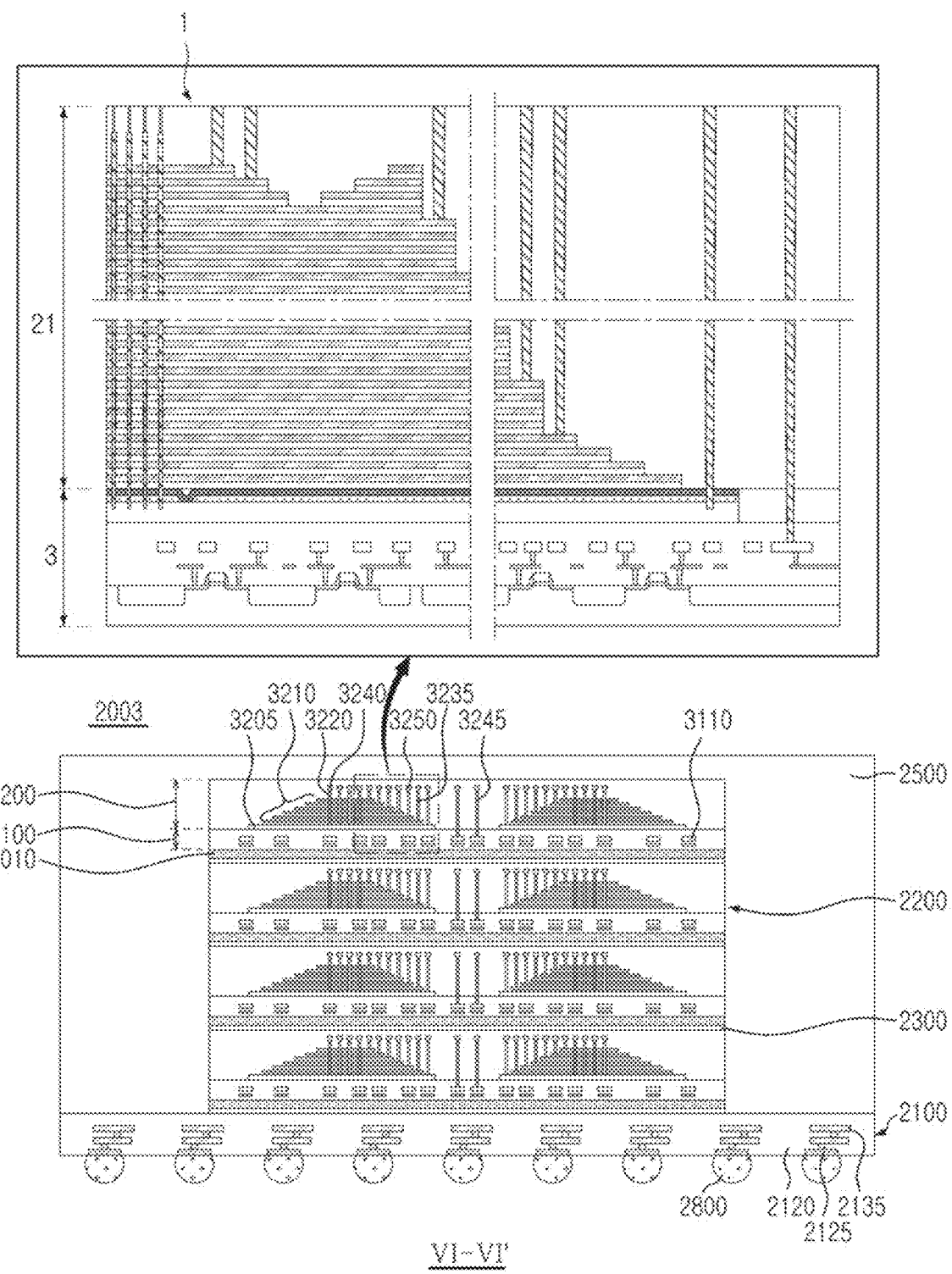
FIG. 14 is a cross-sectional diagram illustrating a data storage system including a semiconductor device, according to an example embodiment of the present disclosure.

FIG. 14 is a cross-sectional diagram illustrating a data storage system including a semiconductor device according to an example embodiment. FIG. 14 illustrates an example embodiment of the semiconductor package 2003 in FIG. 13, illustrating a cross-sectional area of the semiconductor package 2003 in FIG. 13 taken along line VI-VI'.

Referring to FIG. 14, in the semiconductor package 2003, the package substrate 2100 may be configured as a printed circuit board. The package substrate 2100 may include a package substrate body portion 2120, package upper pads disposed on an upper surface of the package substrate body portion 2120, lower pads 2125 disposed on a lower surface of the package substrate body portion 2120 or exposed through the lower portion, and internal wirings 2135 electrically connecting the upper pads 2130 to the lower pads 2125 in the package substrate body portion 2120. The upper pads 2130 may be electrically connected to the connection structures 2400. The lower pads 2125 may be connected to the wiring patterns 2005 of the main substrate 2010 of the data storage system 2000 through conductive connection portions 2800.

Each of the semiconductor chips 2200 may include a semiconductor substrate 3010, a first structure 3100, and a second structure 3200 stacked in order on the semiconductor substrate 3010. The first structure 3100 may include a peripheral circuit area including peripheral wirings 3110. The second structure 3200 may include a common source line 3205, a gate stack structure 3210 on the common source line 3205, memory channel structures 3220 and separation structures 3230 penetrating the gate stack structure 3210, bit lines 3240 electrically connected to the memory channel structures 3220, and gate interconnection lines 93b (in FIG. 2A) electrically connected to the word lines WL of the gate stack structure 3210. The first structure 3100 may include the first structure 1100F in FIG. 12, and the second structure 3200 may include the second structure 1100S in FIG. 12.

Each of the semiconductor chips 2200 may include a through wiring 3245 electrically connected to the peripheral wirings 3110 of the first structure 3100 and extending into the second structure 3200. The through wiring 3245 may penetrate the gate stack structure 3210 and may be further disposed on an external side of the gate stack structure 3210.

Each of the semiconductor chips 2200 may further include an input/output connection wiring 3265 electrically connected to peripheral wirings 3110 of the first structure 3100 and extending into the second structure 3200, and an input/output pad 2210 electrically connected to the input/output connection wiring 3265.

In FIG. 14, the enlarged portion indicated by reference numeral 1 may be provided to describe the example in which the semiconductor chips 2200 in FIG. 14 may be modified to have a cross-sectional structure as in FIG. 2A. Accordingly, each of the semiconductor chips 2200 may include the semiconductor device 1 in one of the aforementioned example embodiments described with reference to FIGS. 1 to 9B or the semiconductor device 1' described with reference to FIG. 10.

According to the aforementioned example embodiments, a semiconductor device which may improve integration density and reliability, and a data storage system including the same may be provided.

While the example embodiments have been illustrated and described above, it will be apparent to those skilled in the art that modifications and variations could be made without departing from the scope of the present disclosure as defined by the appended claims.

What is claimed is:

1. A semiconductor device, comprising:
    a stack structure including interlayer insulating layers and gate layers alternately stacked on a lower structure in a vertical direction;
    a memory vertical structure penetrating through the stack structure;
    a plurality of separation structures penetrating through the stack structure; and a plurality of support vertical structures penetrating through the stack structure,
wherein the gate layers include a lower gate layer, an upper gate layer on the lower gate layer, and a plurality of intermediate gate layers spaced apart from each other in the vertical direction between the lower gate layer and the upper gate layer,
wherein the plurality of separation structures includes a first separation structure,
wherein the plurality of support vertical structures includes a first inner support vertical structure penetrating through the lower gate layer, the plurality of intermediate gate layers, and the upper gate layer, the first inner support vertical structure being adjacent to the first separation structure,
wherein a first portion of the first inner support vertical structure is directly connected to the first separation structure on the same level as the upper gate layer, and
wherein a second portion of the first inner support vertical structure is spaced apart from the first separation structure on the same level as the lower gate layer.

2. The semiconductor device of claim 1,
wherein the plurality of intermediate gate layers includes a first intermediate gate layer,
wherein a third portion of the first inner support vertical structure is spaced apart from the first separation structure by a first distance on the same level as the first intermediate gate layer, and
wherein the second portion of the first inner support vertical structure is spaced apart from the first separation structure by a second distance greater than the first distance on the same level as the lower gate layer.

3. The semiconductor device of claim 1,
wherein the plurality of support vertical structures further includes a first outer support vertical structure adjacent to the first separation structure and spaced apart from the first separation structure,
wherein a distance between the memory vertical structure and the first outer support vertical structure is greater than a distance between the memory vertical structure and the first inner support vertical structure, and
wherein the first outer support vertical structure penetrates through at least one of the plurality of intermediate gate layers and the lower gate layer, and is spaced apart from the upper gate layer.

4. The semiconductor device of claim 3,
wherein the plurality of intermediate gate layers includes a first intermediate gate layer,
wherein the first outer support vertical structure penetrates through the first intermediate gate layer and the lower gate layer, and
wherein a distance between a portion of the first outer support vertical structure penetrating through the first intermediate gate layer and the first separation structure is greater than a distance between a fourth portion of the first inner support vertical structure penetrating through the first intermediate gate layer and the first separation structure.

5. The semiconductor device of claim 1, wherein a lower end of the first inner support vertical structure is at a different level from a lower end of the first separation structure adjacent to the first inner support vertical structure.

6. The semiconductor device of claim 1,
wherein the lower structure includes a substrate, a peripheral circuit on the substrate, and a pattern structure on the peripheral circuit,
wherein the stack structure is disposed on the pattern structure, and
wherein the memory vertical structure and the first inner support vertical structure are in contact with the pattern structure.

7. The semiconductor device of claim 6,
wherein the memory vertical structure includes an insulating gap-fill layer, a channel material layer covering at least a side surface of the insulating gap-fill layer, and a data storage structure on an external side surface of the channel material layer,
wherein the pattern structure includes a first pattern layer, a second pattern layer on the first pattern layer, and a third pattern layer on the second pattern layer,
wherein the second pattern layer penetrates the data storage structure and is in contact with the channel material layer,
wherein the first and third pattern layers are spaced apart from the channel material layer, and
wherein the first, second, and third pattern layers include a silicon layer.

8. The semiconductor device of claim 6,
wherein the stack structure includes a lower stack structure and an upper stack structure on the lower stack structure,
wherein the lower stack structure includes first interlayer insulating layers and first gate layers alternately stacked,
wherein the upper stack structure includes second interlayer insulating layers and second gate layers alternately stacked,
wherein the first and second interlayer insulating layers are configured to form the interlayer insulating layers of the stack structure,
wherein the first and second gate layers are configured to form the gate layers of the stack structure, and
wherein a side surface of the memory vertical structure includes a bent portion between an uppermost gate layer among the first gate layers and a lowermost gate layer among the second gate layers.

9. The semiconductor device of claim 1, further comprising:
a semiconductor substrate on the stack structure;
a peripheral circuit including peripheral devices and upper bonding pads between the semiconductor substrate and the stack structure; and
a lower bonding interconnection structure including lower bonding pads between the stack structure and the peripheral circuit,
wherein the upper bonding pads and the lower bonding pads are in contact with each other and bonded to each other.

10. The semiconductor device of claim 1,
wherein the plurality of separation structures includes a second separation structure parallel to the first separation structure, and a plurality of secondary separation structures disposed between the first separation structure and the second separation structure,
wherein the plurality of secondary separation structures includes inner separation structures and outer separation structures,
wherein the inner separation structures penetrate and are in contact with the lower gate layer, the plurality of intermediate gate layers, and the upper gate layer, wherein the outer separation structures are spaced apart from the upper gate layer and penetrate and are in contact with the plurality of intermediate gate layers and the upper gate layer, wherein each of the plurality of secondary separation structures has a bar shape or a linear shape extending in a first horizontal direction, wherein n number of the inner separation structures are disposed in order in a second horizontal direction perpendicular to the first horizontal direction between the first separation structure and the second separation structure, wherein m number of the outer separation structures are disposed in order in the second horizontal direction between the first separation structure and the second separation structure, and wherein n and m are different natural numbers.

11. The semiconductor device of claim 10, wherein n is greater than m.

12. The semiconductor device of claim 10,
wherein n is an odd number, and
wherein m is an even number.

13. The semiconductor device of claim 10,
wherein the plurality of support vertical structures further includes a plurality of second inner support vertical structures between the first separation structure and the second separation structure, wherein the first inner support vertical structure and the plurality of second inner support vertical structures are arranged to be spaced apart from each other in the second horizontal direction, wherein the plurality of support vertical structures further includes a plurality of outer support vertical structures arranged to be spaced apart from each other in the second horizontal direction between the first separation structure and the second separation structure, and wherein a number of the first and second inner support vertical structures, arranged to be spaced apart from each other in the second horizontal direction, is greater than a number of the plurality of outer support vertical structures arranged to be spaced apart from each other in the second horizontal direction, between the first separation structure and the second separation structure.

14. The semiconductor device of claim 13,
wherein the first inner support vertical structure and the plurality of second inner support vertical structures are adjacent to the inner separation structures in the second horizontal direction, and wherein the plurality of outer support vertical structures are adjacent to the outer separation structures in the second horizontal direction.

15. The semiconductor device of claim 14,
wherein the plurality of support vertical structures further includes buffer support vertical structures arranged to be spaced apart from each other in the second horizontal direction between the first separation structure and the second separation structure, wherein the buffer support vertical structures do not face the inner separation structures and the outer separation structures in the second horizontal direction, and wherein a number of the buffer support vertical structures arranged to be spaced apart from each other in the second horizontal direction is smaller than the number of the first and second inner support vertical structures, arranged to be spaced apart from each other in the second horizontal direction, and is greater than the number of the plurality of outer support vertical structures arranged to be spaced apart from each other in the second horizontal direction.

16. The semiconductor device of claim 1,
wherein the memory vertical structure includes a channel material layer, and
wherein the plurality of support vertical structures do not include a material of the channel material layer.

17. A semiconductor device, comprising:
a stack structure including interlayer insulating layers and gate layers alternately stacked in a vertical direction on a lower structure;
a plurality of separation structures penetrating through the stack structure;
a plurality of support vertical structures penetrating through the stack structure in a staircase area on the lower structure; and
a memory vertical structure penetrating through the stack structure in a memory cell array area on the lower structure,
wherein the gate layers include a lower gate layer, an upper gate layer on the lower gate layer, and a plurality of intermediate gate layers spaced apart from each other in the vertical direction between the lower gate layer and the upper gate layer,
wherein the gate layers include gate pads arranged in a staircase shape within the staircase area,
wherein the plurality of separation structures includes a first separation structure,
wherein the plurality of support vertical structures includes inner support vertical structures and outer support vertical structures, disposed in the staircase area,
wherein the inner support vertical structures penetrate through the lower gate layer, the plurality of intermediate gate layers, and the upper gate layer,
wherein a side surface of at least one of the inner support vertical structures includes an upper portion in contact with the first separation structure on the same levels as the gate layers,
wherein the outer support vertical structures penetrate through the lower gate layer and the plurality of intermediate gate layers in a position spaced apart from the upper gate layer, and
wherein an entire side surface of the outer support vertical structures is spaced apart from the first separation structure.

18. The semiconductor device of claim 17,
wherein the memory vertical structure includes a channel material layer,
wherein the plurality of support vertical structures do not include a material of the channel material layer,
wherein the side surface of the at least one of the inner support vertical structures further includes a lower portion not in contact with the first separation structure on the same levels as the gate layers, and
wherein the upper portion is disposed on a level higher than the lower portion.

19. A data storage system, comprising:
a main substrate;
a semiconductor device on the main substrate; and
a controller electrically connected to the semiconductor device on the main substrate,
wherein the semiconductor device includes:
a stack structure including interlayer insulating layers and gate layers alternately stacked on a lower structure in a vertical direction;

a memory vertical structure penetrating through the stack structure;

a plurality of separation structures penetrating through the stack structure; and a plurality of support vertical structures penetrating through the stack structure, wherein the gate layers include a lower gate layer, an upper gate layer on the lower gate layer, and a plurality of intermediate gate layers spaced apart from each other in the vertical direction between the lower gate layer and the upper gate layer, wherein the plurality of separation structures includes a first separation structure, wherein the plurality of support vertical structures includes a first inner support vertical structure penetrating through the lower gate layer, the plurality of intermediate gate layers, and the upper gate layer, the first inner support vertical structure being adjacent to the first separation structure, wherein a first portion of the first inner support vertical structure is directly connected to the first separation structure on the same level as the upper gate layer, and wherein a second portion of the first inner support vertical structure is spaced apart from the first separation structure on the same level as the lower gate layer.

20. The semiconductor device of claim 19, wherein the plurality of support vertical structures further includes a first outer support vertical structure adjacent to the first separation structure and spaced apart from the first separation structure, wherein a distance between the memory vertical structure and the first outer support vertical structure is greater than a distance between the memory vertical structure and the first inner support vertical structure, wherein the first outer support vertical structure penetrates through at least one of the plurality of intermediate gate layers and the lower gate layer, and is spaced apart from the upper gate layer, wherein the plurality of intermediate gate layers includes a first intermediate gate layer, wherein the first outer support vertical structure penetrates the first intermediate gate layer and the lower gate layer, and wherein a distance between a portion of the first outer support vertical structure penetrating through the first intermediate gate layer and the first separation structure is greater than a distance between a third portion of the first inner support vertical structure penetrating through the first intermediate gate layer and the first separation structure, on the same level as the first intermediate gate layer.

* * * * *